United States Patent
Miyajima et al.

(10) Patent No.: US 6,791,670 B2
(45) Date of Patent: Sep. 14, 2004

(54) EXPOSURE APPARATUS, DEVICE MANUFACTURING METHOD, SEMICONDUCTOR MANUFACTURING FACTORY, AND EXPOSURE APPARATUS MAINTENANCE METHOD

(75) Inventors: Yoshikazu Miyajima, Tochigi (JP); Kazuhito Outuka, Tokyo (JP); Keiji Emoto, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/022,506

(22) Filed: Dec. 20, 2001

(65) Prior Publication Data

US 2002/0081528 A1 Jun. 27, 2002

(30) Foreign Application Priority Data

Dec. 26, 2000 (JP) .................................. 2000-395819

(51) Int. Cl.⁷ .................. G03B 27/42; G03B 27/58; G03B 27/62; G03B 27/32
(52) U.S. Cl. ...................... 355/72; 355/53; 355/75; 355/77
(58) Field of Search ............................. 355/53, 72, 75, 355/77

(56) References Cited

U.S. PATENT DOCUMENTS

| | | | |
|---|---|---|---|
| 4,131,988 A | 1/1979 | Finegold ..................... 29/596 |
| 4,340,833 A | * 7/1982 | Sudo et al. ................. 310/268 |
| 4,602,175 A | 7/1986 | Castagna .................... 310/13 |
| 4,618,789 A | 10/1986 | Flisikowski ................. 310/13 |
| 4,760,294 A | * 7/1988 | Hansen ....................... 310/13 |
| 4,816,710 A | 3/1989 | Silvaggio et al. .......... 310/194 |
| 4,975,611 A | 12/1990 | Rochester ................... 310/194 |
| 5,519,266 A | * 5/1996 | Chitayat .................... 310/12 |
| 5,808,381 A | 9/1998 | Aoyama et al. ............. 310/12 |
| 6,002,465 A | * 12/1999 | Korenaga ..................... 355/53 |
| 6,011,339 A | 1/2000 | Kawakami ................... 310/208 |
| 6,084,319 A | 7/2000 | Kamata et al. .............. 310/12 |
| 6,107,703 A | 8/2000 | Korenaga .................... 310/12 |
| 6,226,073 B1 | 5/2001 | Emoto ......................... 355/53 |
| 6,262,794 B1 | 7/2001 | Miyajima .................... 355/53 |
| 6,265,793 B1 | 7/2001 | Korenaga .................... 310/12 |
| 6,266,133 B1 | 7/2001 | Miyajima et al. ............ 355/72 |
| 6,278,205 B1 | 8/2001 | Reinhold ..................... 310/67 |
| 6,320,649 B1 | 11/2001 | Miyajima et al. ............ 355/72 |
| 2002/0089239 A1 | 7/2002 | Emoto et al. ................ 310/12 |

FOREIGN PATENT DOCUMENTS

| | | |
|---|---|---|
| JP | 10-309071 | 11/1988 |
| JP | 8-107665 | 4/1996 |
| JP | 10-12539 | 1/1998 |
| JP | 11-122904 | 4/1999 |
| JP | 2000209838 A * | 7/2000 |
| JP | 2000-261997 | 9/2000 |
| JP | 2000-324789 | 11/2000 |

OTHER PUBLICATIONS

Partial European Search Report dated Oct. 29, 2003, issued in corresponding European patent appln. No. 01 31 0261, forwarded in a Communication dated Nov. 2, 2003.

* cited by examiner

Primary Examiner—Rodney Fuller
(74) Attorney, Agent, or Firm—Fitzpatrick, Cella, Harper & Scinto

(57) ABSTRACT

A linear motor apparatus includes a movable member having a magnet, and a coil wound about the magnet so as to generate a drive force for driving the movable member and having a multi-layer structure formed by winding a foil-like conductor and an insulating layer. The foil-like conductor (i) has a plurality of partial coils having identical current application/rotation directions, and the plurality of partial coils are formed in such a way that the foil-like conductor forms a continuous, seamless strip, and (ii) is continuously wound in a multilayered, aligned state to form the coil, and adjacent layers of the foil-like conductor are insulated by the insulating layer.

47 Claims, 33 Drawing Sheets

(SECTIONAL VIEW TAKEN ALONG LINE A-A)

ENLARGED VIEW OF PORTION B 16  20  16d 16e  16f 16e  16f 16e  16f 16  20

16e  16f 16e  16f 16e  16f

ENLARGED VIEW OF PORTION E

ENLARGED VIEW OF PORTION F

INNER CIRCUMFERENTIAL
SURFACE α WINDING

INNER CIRCUMFERENTIAL
SURFACE BENDING / SHIFT WINDING

SEMICONDUCTOR DEVICE MANUFACTURING FLOW (SECTIONAL VIEW TAKEN ALONG LINE G-G)

ENLARGED VIEW OF PORTION H

ENLARGED VIEW OF PORTION I (ENLARGED VIEW OF PORTION J)

(ENLARGED VIEW OF PORTION K)

PROJECTION AT END OF INSULATING BASE FILM (ENLARGED VIEW OF PORTION L)

F I G. 28A
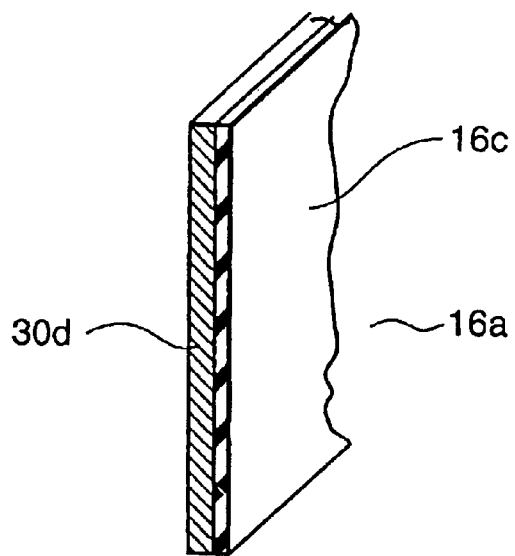
F I G. 28B
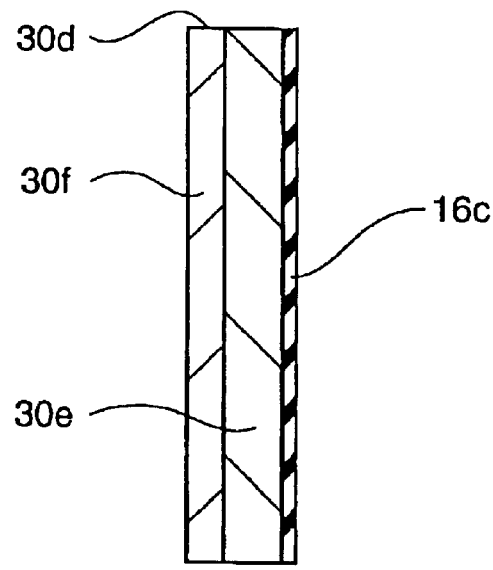
F I G. 28C
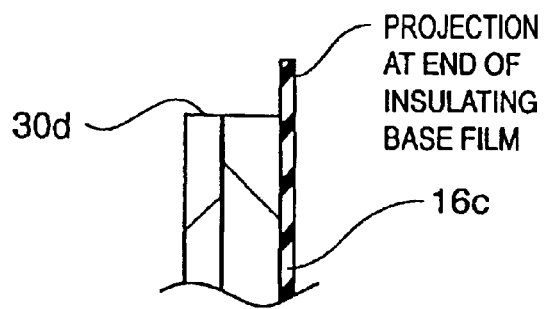

(SECTIONAL VIEW TAKEN ALONG LINE M-M)

FIG. 33

```
URL  http://www.maintain.co.jp/db/input.html

TROUBLE DB INPUT WINDOW

OCCURRENCE DATE  [2000/3/15]~404
TYPE OF APPARATUS  [**********]~401
OBJECT  [OPERATION ERROR (START-UP ERROR)]~403
DEVICE S/N  [465NS4580001]~402
DEGREE OF URGENCY  [D]~405
SYMPTOM  [LED KEEPS FLICKERING AFTER
          POWER ON]~406

REMEDY   [POWER ON AGAIN
          (PRESS RED BUTTON IN ACTIVATION)]~407

PROGRESS [INTERIM HAS BEEN DONE]~408

[SEND] [RESET]      410                411              412
LINK TO RESULT LIST DATABASE  SOFTWARE LIBRARY  OPERATION GUIDE
```

EXPOSURE APPARATUS, DEVICE MANUFACTURING METHOD, SEMICONDUCTOR MANUFACTURING FACTORY, AND EXPOSURE APPARATUS MAINTENANCE METHOD

FIELD OF THE INVENTION

The present invention relates to an exposure apparatus used in a semiconductor manufacturing process or the like, particularly, to a projection exposure apparatus for projecting and transferring the pattern of a reticle as a master onto a silicon wafer as a substrate and, more particularly, to an exposure apparatus having a linear motor for driving reticle and wafer stages for sequentially moving the reticle and silicon wafer with respect to a projection exposure system when projecting a reticle pattern onto the wafer.

The present invention relates to an exposure apparatus having a linear motor for transmitting the reaction forces of reticle and wafer stages, or a damping linear motor on the mount of a main body structure, which supports each stage and a projection optical system.

The present invention relates to a semiconductor device manufacturing method using the exposure apparatus noted above, and a maintenance method for the exposure apparatus.

BACKGROUND OF THE INVENTION

A conventional linear motor will be described with reference to FIGS. 19A, 19B, and 20 to 22.

FIGS. 19A and 19B are schematic views showing a conventional linear motor. In FIGS. 19A and 19B, a plurality of coils 116 are aligned within an effective stroke in the driving direction of an X linear motor 109, and the lead line of each coil 116 is connected to a connector 118. A fine moving stage 107 incorporates movable magnets 119 with respect to the coils 116 serving as linear motor stationary members. By flowing a driving current through the coils 116, the fine moving stage 107 is moved in a moving direction (±X direction), indicated by the arrow by the movable magnets 119 magnetized as shown in FIG. 19B, by a Lorentz force.

The coil 116 conventionally uses a round wire coil 116a with a round section, as shown in FIG. 20. The core of the round wire coil 116a is made of a copper wire 116b, and the outer surface is coated with an insulating layer 116c made of polyimide or polyurethane.

The wound state of the round wire coil 116a is shown in FIG. 21, which is an enlarged view of a portion H shown in FIG. 19B. The coil 116 is obtained by winding the round wire coil 116a around a hollow coil into a sectional shape as shown in FIG. 21. As shown in FIG. 22, which is an enlarged view of a portion 1, the round wire coil 116a is continuously wound in alignment to form the coil 116, and the coil 116 constitutes the X linear motor 109.

The coil 116 wound with the conventional round wire coil 116a adopts the multilayered structure of the round wire, so a large gap is formed between adjacent round wire layers. The space factor of the copper wire 116b with respect to a coil section of aligned winding can only be increased to around 75%, failing to increase the current density of a driving current supplied to the coil.

As a result, the linear motor efficiency by the stationary coil and movable magnet cannot be increased for a constant volume, and the stage apparatus cannot attain higher speed and lower power consumption.

SUMMARY OF THE INVENTION

The present invention has been proposed to solve the conventional problems, and has as its object to decrease a gap in a conventional round wire coil to increase the space factor of a copper wire with respect to the coil section, thereby increasing the current density of a driving current supplied to the coil, increasing the linear motor efficiency by a stationary coil and a movable magnet for a constant volume, and ultimately, realizing higher speed and lower power consumption of a stage apparatus.

According to the present invention, the foregoing object is attained by providing an exposure apparatus for exposing a substrate to a pattern drawn on a master surface, comprising a driving unit for moving master and substrate stages or a linear motor for generating control power for cutting off transmission of a reaction force and/or an external vibration to the exposure apparatus in driving the stages, wherein the linear motor has a coil formed by winding a foil-like conductor having an insulating layer in a multilayered structure.

The present invention having this arrangement adopts a coil formed by winding in a multilayered structure a film-like member (to be referred to as a foil coil hereinafter) made of foil-like conductor having an insulating layer. This coil can easily increase the space factor of the conductor with respect to the coil section and implement a high-efficiency linear motor.

According to the present invention, the foregoing object is attained by providing an exposure apparatus for exposing a substrate to a pattern drawn on a master surface, comprising a driving unit for moving master and substrate stages or a linear motor for generating control power for cutting off transmission of a reaction force and/or an external vibration to the exposure apparatus in driving the stages, wherein the linear motor has a coil formed by winding a foil-like conductor in a multilayered structure via an insulating layer, and a lead line for connecting an inner or outer end of the coil to an external electrode.

At least part of the lead line is made of the foil-like conductor, which constitutes the coil. This can prevent deformation of the side surface of the coil caused by a copper wire or the like. Substantially a space corresponding to the coil thickness allows attaching the coil. This coil is constituted by winding the foil-like conductor in a multilayered structure, so that the two ends of the coil are positioned on the inner and outer circumferential surfaces. A lead line connected to the inner end is generally extracted in the outer circumferential direction of the coil. Electrical insulation between the lead line and the side surface of the coil main body can be compensated for by using an insulator for insulting the coil main body from the lead line extracted from the inner end.

According to the present invention, the foregoing object is attained by providing an exposure apparatus for exposing a substrate to a pattern drawn on a master surface, comprising a driving unit for moving master and substrate stages or a linear motor for generating control power for cutting off transmission of a reaction force and/or an external to the exposure apparatus in driving stages, wherein the linear motor has a coil formed by winding a foil-like conductor in a multilayered structure via an insulating layer, and a relay substrate for connecting an inner or outer end of the coil to an external electrode.

The relay substrate is disposed at a predetermined portion in the inner or outer circumferential surface direction of the coil or in the side surface direction in contact with the edges of the inner and outer circumferential surfaces. The relay substrate is connected to a connection terminal between the relay substrate and an external electrode and a lead line extending from an inner or outer end, and relays them. The relay substrate is, e.g., a substrate bearing another conductor wire or conductor pattern, or a flexible substrate. The use of the relay substrate can prevent disconnection or a short circuit caused by the tangle of a lead line, a cooling solution, or the like, and can implement a compact, and simple, linear motor even when many lead lines are laid out inside a linear motor constituted by aligning a plurality of coils. Accordingly, the linear motor can be easily manufactured, attached, and maintained in an exposure apparatus limited in the installation space for members. Cost reduction can also be expected in the manufacture and operation of the apparatus.

According to the present invention, the foregoing object is attained by providing an exposure apparatus for exposing a substrate to a pattern drawn on a master surface, comprising a driving unit for moving master and substrate stages or a linear motor for generating control power for cutting off transmission of a reaction force and/or an external vibration to the exposure apparatus in driving the stages, wherein the linear motor has a seamlessly continuous coil formed from a plurality of partial coils prepared by winding a foil-like conductor in a multilayered structure via an insulating layer so as to make current application/rotation directions coincide with each other.

In general, this coil is constituted by spacing apart or stacking a plurality of partial coils in the gap direction of a magnetic circuit. This enables a coolant to flow through a gap between the partial coils and cooling the coil from the center. Causing a coolant to flow through the center requires two partial coils. A foil-like conductor between the two different partial coils is bent spirally (α winding) or bent at a right angle twice in the same rotational direction (shift winding), thereby continuously forming the coil. In this case, the coil is preferably constituted such that the foil-like conductor is wound spirally or by bending it a plurality of number of times between the two partial coils. By continuously forming the inner circumferential surface, any lead line need not be extracted from the inner circumferential surface, and the coil can be simplified.

According to the present invention, the foregoing object is attained by providing an exposure apparatus for exposing a substrate to a pattern drawn on a master surface, comprising a driving unit for moving master and substrate stages or a linear motor for generating a control power for cutting off transmission of a reaction force and/or an external vibration to the exposure apparatus in driving the stages, wherein the linear motor has a coil, which is formed by winding a foil-like conductor in a multilayered structure via an insulating layer and has a through hole.

The through hole is formed to supply a coolant into the multilayered portion of the coil. The through hole generally extends from the inner circumferential surface to the outer circumferential surface at an intermediate or arbitrary position on the foil-like conductor of the coil in the direction of the width. By forming a hole extending through the coil, the coolant can flow through the through hole to efficiently cool the coil. A linear motor can be easily designed, which obtains an optimal cooling efficiency while maximally maintaining the space factor of the conductor. The wall surface of the through hole is desirably insulated.

According to the present invention, the foregoing object is attained by providing a semiconductor manufacturing method comprising the steps of installing a plurality of semiconductor manufacturing apparatuses, including an exposure apparatus, in a semiconductor manufacturing factory, and manufacturing a semiconductor device by using the plurality of semiconductor manufacturing apparatuses, wherein the exposure apparatus includes a driving unit for moving master and substrate stages or a linear motor for generating control power for cutting off transmission of a reaction force and/or an external vibration to the exposure apparatus in driving the stages, and the linear motor has a coil formed by winding a foil-like conductor having an insulating layer in a multilayered structure.

According to the present invention, the foregoing object is attained by providing a semiconductor manufacturing factory comprising a plurality of semiconductor manufacturing apparatuses including an exposure apparatus, a local area network for connecting the plurality of semiconductor manufacturing apparatuses, and a gateway for allowing access to an external network outside the factory from the local area network and allowing communicating information about at least one of the plurality of semiconductor manufacturing apparatuses, wherein the exposure apparatus includes a driving unit for moving master and substrate stages or a linear motor for generating a control power for cutting off transmission of a reaction force and/or an external vibration to the exposure apparatus in driving the stages, and the linear motor has a coil formed by winding a foil-like conductor having an insulating layer in a multilayered structure.

According to the present invention, the foregoing object is attained by providing a maintenance method for an exposure apparatus, comprising the steps of preparing a database for accumulating information about maintenance of the exposure apparatus on an external network outside a factory in which the exposure apparatus is installed, connecting the exposure apparatus to a local area network in the factory, and maintaining the exposure apparatus on the basis of information accumulated in the database by using the external network and the local area network, wherein the exposure apparatus includes a driving unit for moving master and substrate stages or a linear motor for generating control power for cutting off transmission of a reaction force and/or an external vibration to the exposure apparatus in driving the stages, and the linear motor has a coil formed by winding a foil-like conductor having an insulating layer in a multilayered structure.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 28A to 28C are a perspective view and sectional views, respectively, for explaining still another structure of the foil coil according to the eighth embodiment;

FIG. 33 is a view showing an example of a user interface.

DETAILED DESCRIPTION OF THE PREFERRED EMBODIMENTS

Figure 1:
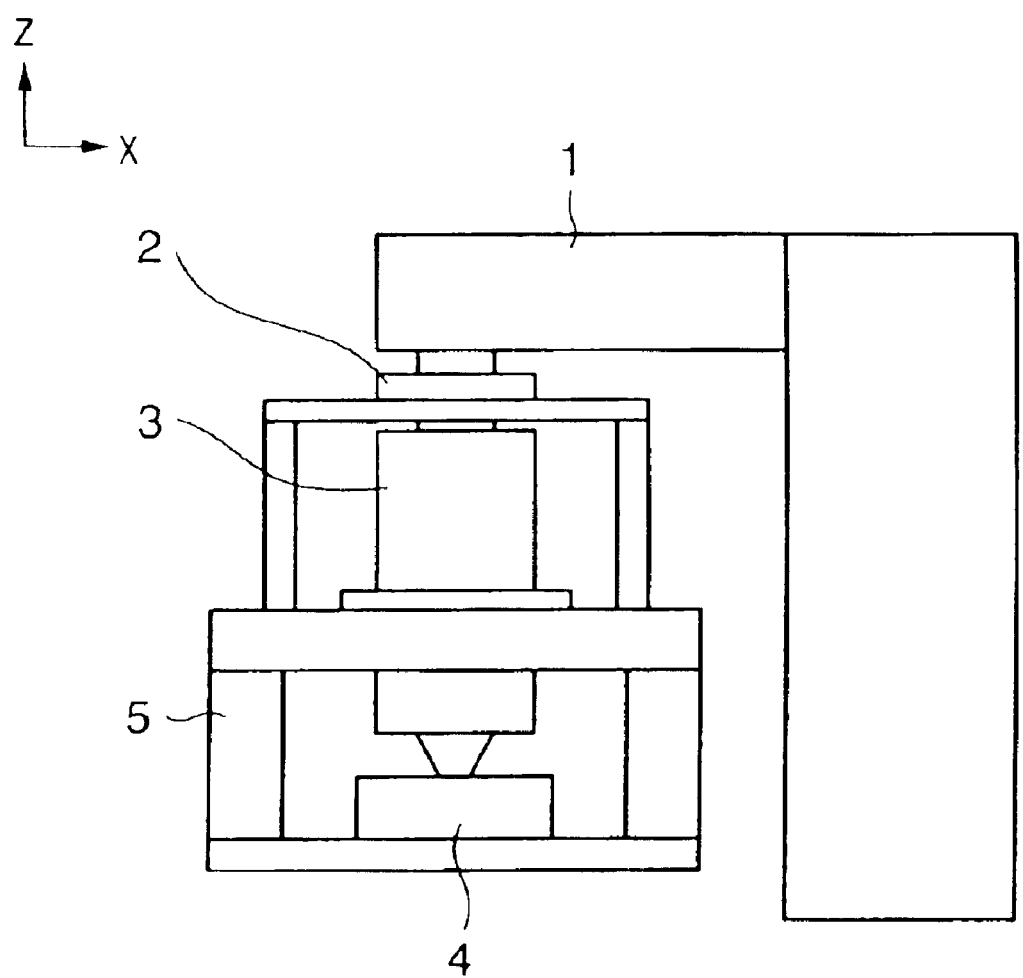
FIG. 1 is a schematic view for explaining an entire exposure apparatus according to the first embodiment.

Preferred embodiments of the present invention will now be described in detail in accordance with the accompanying drawings.

A preferred embodiment of the present invention will now be explained. This embodiment of the present invention relates to a projection exposure apparatus for projecting a master pattern onto a substrate via a projection optical system or by an electron beam. This exposure apparatus comprises a stage apparatus which supports a master or substrate. A linear motor having a multilayered coil can be used to drive the stage apparatus. The stage apparatus relatively drives both a master and a substrate with respect to the exposure optical axis at a predetermined projection magnification in, e.g., scan exposure in order to repetitively expose the substrate to the master pattern, and relatively drives only the substrate with respect to the master step by step in exposing a plurality of positions of the substrate to the master pattern. This can achieve higher speed and lower power consumption of stage driving, and can increase the total throughput of the apparatus.

The exposure apparatus of the present invention can communicate maintenance information for the exposure apparatus via a computer network by using a display, a network interface, and a computer for executing network software. The network software enables obtaining information from a database via an external network by providing on the display a user interface, which is connected to the external network of a factory where the exposure apparatus is installed and which allows access to a maintenance database provided by the vendor or user of the exposure apparatus.

To transmit a reaction force from the stage apparatus which supports a master or substrate, the linear motor comprises a damping means for a main body structure which supports a projection optical system, and the stage apparatus which supports a master or substrate. The damping means can increase the exposure precision.

Particularly, when the linear motor is mounted as a driving means for the stage apparatus, the linear motor generally comprises a plurality of coils aligned so as to make the outer circumferential surfaces of adjacent coils face each other. In this linear coil, the stationary members comprise coils, and the movable members comprise magnets.

The coil desirably uses an insulator for insulating the coil main body from a lead line connected to the inner end of the coil or insulating the inner circumferential surface, outer circumferential surface, or side surface of the coil main body. This insulator or a member for forming the insulating layer of the coil can be made of a flexible insulating sheet of a polymer material, an insulating film, an insulating coat, or an oxide film of a conductor metal itself which forms a foil-like conductor. The insulating film is preferably an insulating base film using a paraffin-based fully aromatic polyamide fiber or resin. The paraffin-based fully aromatic polyamide fiber or resin is more rigid than a general polyester- or polyimide-based film, and can increase the coil rigidity after being wound around the coil. The insulating layer is desirably adhered to one or two surfaces of a foil-like conductor in advance. A multilayered coil can be easily formed by directly winding a film-like member (to be referred to as a foil coil hereinafter) of two layers formed by adhering an insulating layer to a foil-like conductor (or three layers when insulating layers are adhered to two surfaces).

The foil-like conductor can be a copper foil, an aluminum foil, a copper-aluminum alloy foil, a silver foil, or a gold foil. The foil-like conductor may use a single metal foil, but may use a cladding member with a multilayered structure made up of conductors of different materials (e.g., a multilayered structure of different metals.) The cladding member is formed from a conductive material and a high-permeability material. Forming the foil-like conductor from the cladding member can reduce the coil weight, increase the gap magnetic flux density by the high-permeability material, and improve the frequency response characteristic of the coil.

The material which forms the coil is desirably a high-permeability material such as a ferrite alloy, Ni alloy, or permalloy foil or the foil-like conductor. Such a material can increase the gap magnetic flux density.

To prevent a rare short circuit on the side surface and corner of the coil main body, the foil-like conductor is oxidized on the side end or corner of the coil in the direction of the width. A short circuit can be prevented between conductor layers by setting the width of the insulating layer slightly larger than that of the foil-like conductor to secure insulation between adjacent conductor layers at the end of the conductor foil when the foil-like conductor having the insulating layer is wound in a multilayered structure.

First Embodiment

The first embodiment of the present invention will be described with reference to FIGS. 1 to 6.

FIG. 1 shows an overall exposure apparatus according to the first embodiment. In FIG. 1, reference numeral 1 denotes an illumination system unit having an exposure light source and a function of shaping exposure light and irradiating a reticle; 2, a reticle stage which supports a reticle serving as an exposure pattern master and scans the reticle with respect to a wafer serving as a substrate at a predetermined exposure reduction ratio to the wafer; 3, a reduction projection lens of a projection optical system for reducing and projecting a master pattern onto a wafer; 4, a wafer stage for sequentially moving a wafer for every exposure; and 5, an exposure apparatus main body, which supports the reticle stage 2, projection lens 3, and wafer stage 4.

Figure 2:
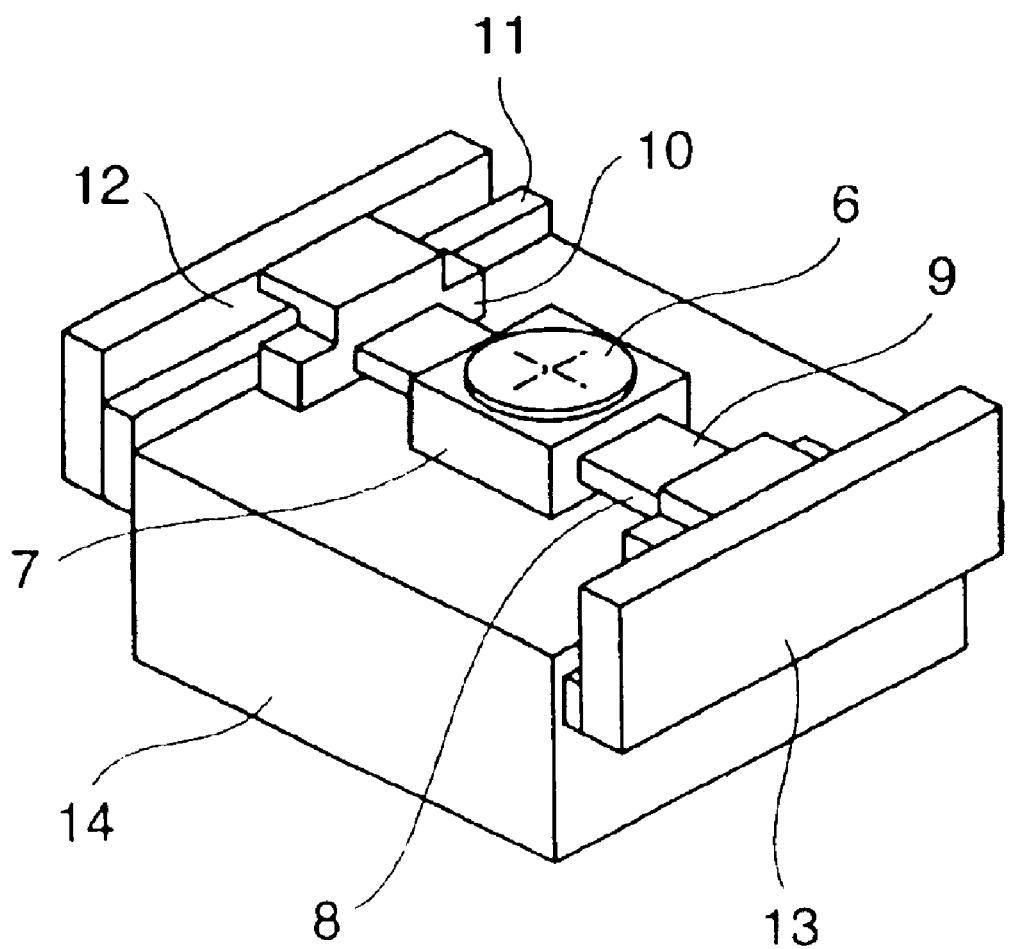
FIG. 2 is a perspective view showing a stage apparatus according to the first embodiment.
Figure 2:
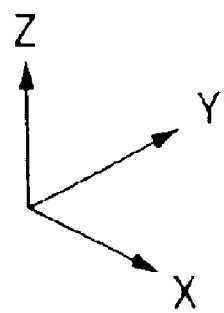

FIG. 2 is a perspective view showing a stage apparatus according to the first embodiment. This stage apparatus relatively moves a set wafer with respect to the exposure optical axis.

In FIG. 2, reference numeral 6 denotes a wafer with a single-crystal silicon substrate surface coated with a resist in order to project and transfer a reticle pattern drawn on a reticle via a reduction exposure system; 7, a fine moving stage for finely adjusting the wafer 6 in the optical axis and tilt directions of the reduction exposure system and in a rotational direction around the optical axis; 8, an X guide for guiding movement of the fine moving stage 7 in the X-axis direction; 9, an X linear motor for driving the Fine moving stage 7 in the X direction; 10, a Y slider for moving and guiding the X guide 8 and fine moving stage 7 in the Y direction; 11, a yaw guide for guiding the Y slider 10 in the Y direction; 12, a YL linear motor for driving the Y slider 10 in the Y direction; 13, a YR linear motor; and 14, a stage surface plate for floating the movable member by hydrostatic pads attached to the lower surfaces of the fine moving stage 7 and Y slider 10, and vertically supporting and guiding the movable member.

Figure 3A:
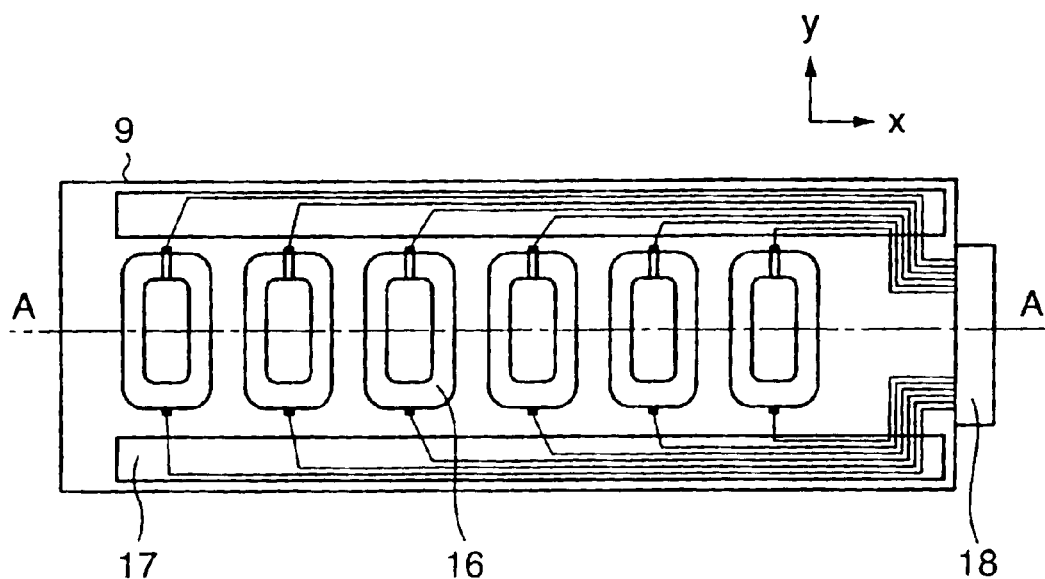
FIG. 3A is a plan view showing a linear motor according to the first embodiment when viewed from the top.
Figure 3B:
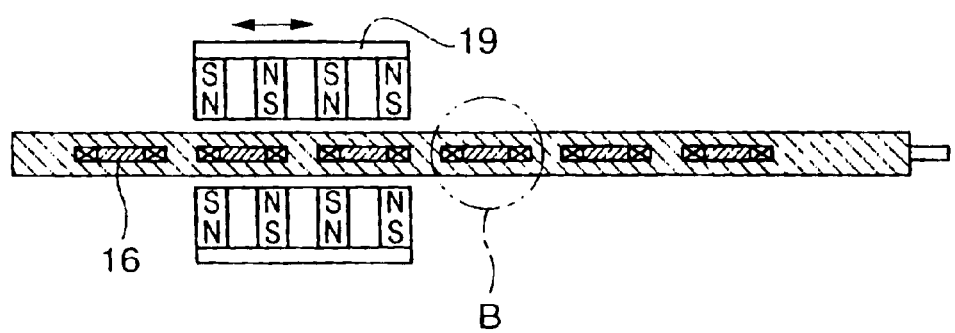
FIG. 3B is a sectional view taken along the line A—A in FIG. 3A.

The X linear motor 9, YL linear motor 12, and YR linear motor 13 in the above arrangement have a structure shown in FIGS. 3A and 3B. FIG. 3A is a plan view showing the stationary member of the X linear motor 9 when viewed from above (from the side of the coil), and FIG. 3B is a sectional view taken along the line A—A in FIG. 3A.

In FIGS. 3A and 3B, a plurality of coils 16 are aligned within an effective stroke in the driving direction of the X linear motor 9. The lead line of each coil 16 is connected to a relay substrate 17 bearing an extraction pattern for extracting the electrode of the coil 16 to the outside of the linear motor. Further, the lead line of the coil 16 is connected via the relay substrate 17 to a connector 18 for connecting the lead line to an external electrode. The fine moving stage 7 incorporates movable magnets 19 magnetized as shown in FIG. 3B with respect to the linear motor stationary members. By causing a driving current to flow through the coils 16, the movable magnets 19 are moved by a Lorentz force in a moving direction (±X direction) indicated by the arrow, thereby driving the fine moving stage 7.

Figure 4:
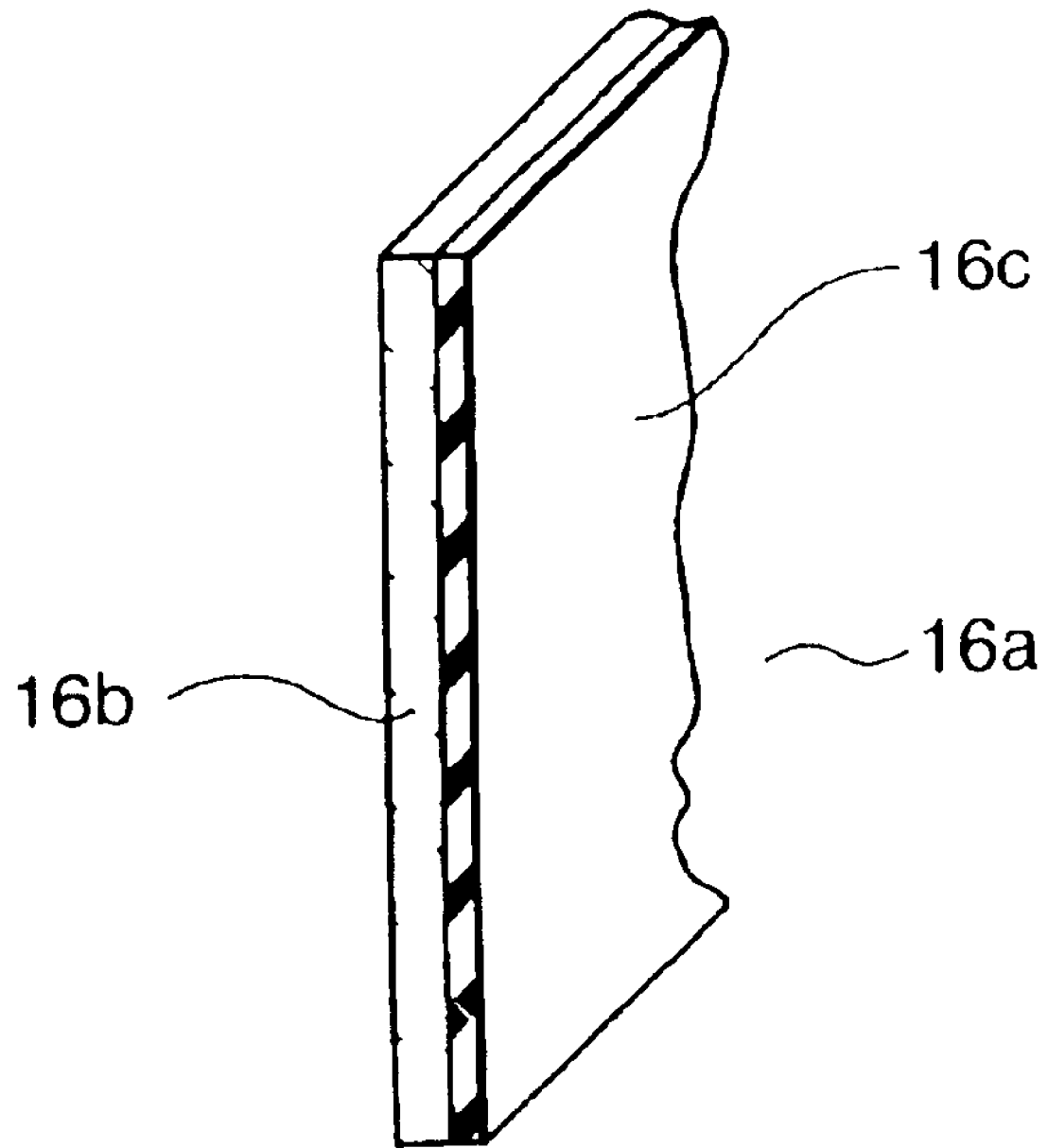
FIG. 4 is a perspective view for explaining a foil coil according to the first embodiment.

FIG. 4 shows a foil coil 16a used for the coil 16.

In FIG. 4, the foil coil 16a has a copper foil 16b serving as a foil-like conductor with a foil-like section and a thickness of about several micrometers ($\mu$m) to several tens of micrometers ($\mu$m), and an insulating base film 16c serving as an insulating layer with a thickness of several micrometers ($\mu$m). The copper foil 16b is deposited on or adhered to one surface of the insulating base film 16c.

Figure 5:
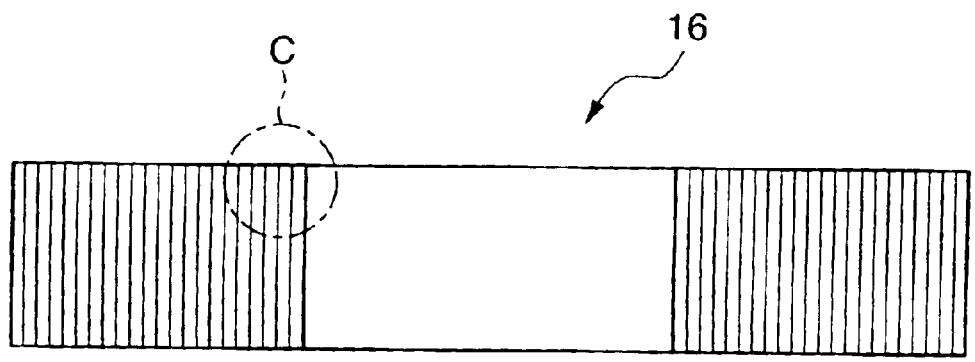
FIG. 5 is an enlarged, sectional view showing a portion B in FIG. 3B.
Figure 6:
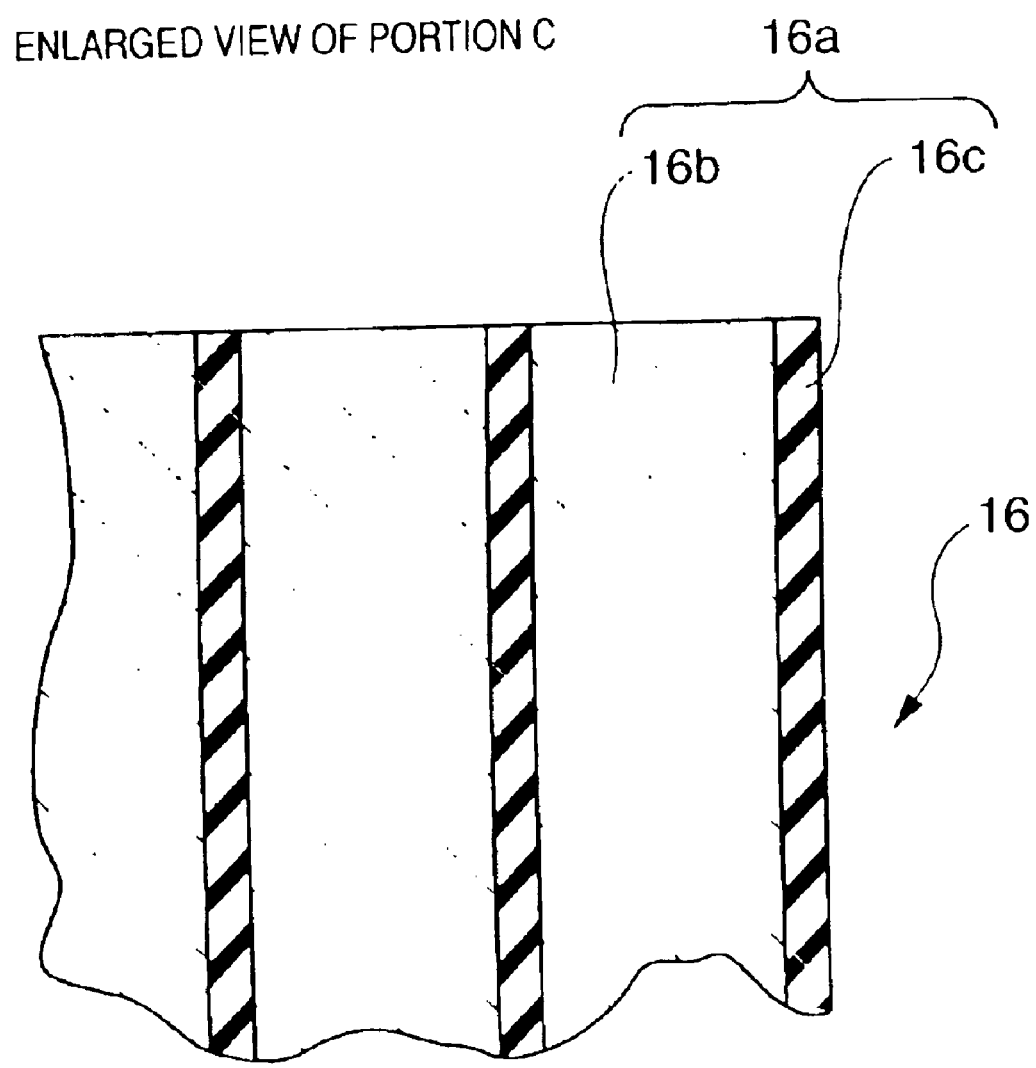
FIG. 6 is an enlarged, sectional view showing a portion C in FIG. 5.

FIG. 5 is an enlarged view of a portion B when the foil coil 16a in FIG. 4 is wound. FIG. 6 is an enlarged view of a portion C in FIG. 5.

The coil 16 is formed by winding the foil coil 16a into a multilayered hollow coil with a sectional shape shown in FIG. 5. As shown in FIG. 6, the foil coil 16a is continuously wound in a multilayered, aligned state to form the coil 16. As a result, adjacent layers of the copper foil 16b are insulated by the sandwiched insulating base film. The coil 16 constitutes the stationary coil of the X linear motor 9.

In the coil 16 wound with the foil coil 16a according to the first embodiment, the nonconductive air gap other than the insulating base film 16c greatly decreases in comparison with a conventional coil employing the multilayered structure of a round wire. The space factor of the copper wire with respect to the section of a coil wound in a multilayered aligned state increased to about 90% to 95%, which is about 15% to 20% higher than a space factor of about 75% for a conventional round wire.

In other words, a larger number of coil turns can be obtained while the coil resistance value of a conventional round wire is maintained. The effective length of the coil for generating a driving thrust can increase, remarkably increasing the driving current density of the coil.

As a result, the linear motor efficiency by the stationary coil and movable magnet can be increased by about 15% to 20% for a constant volume, realizing higher speed and lower power consumption of the stage apparatus.

Note that the stationary coil of the X linear motor 9 has been described, but the present invention is not limited to this. The stationary coils of the YL and YR linear motors 12 and 13 can also be constituted in the above-described manner.

Second Embodiment

The second embodiment of the present invention will be described with reference to FIGS. 14 and 15.

Figure 14:
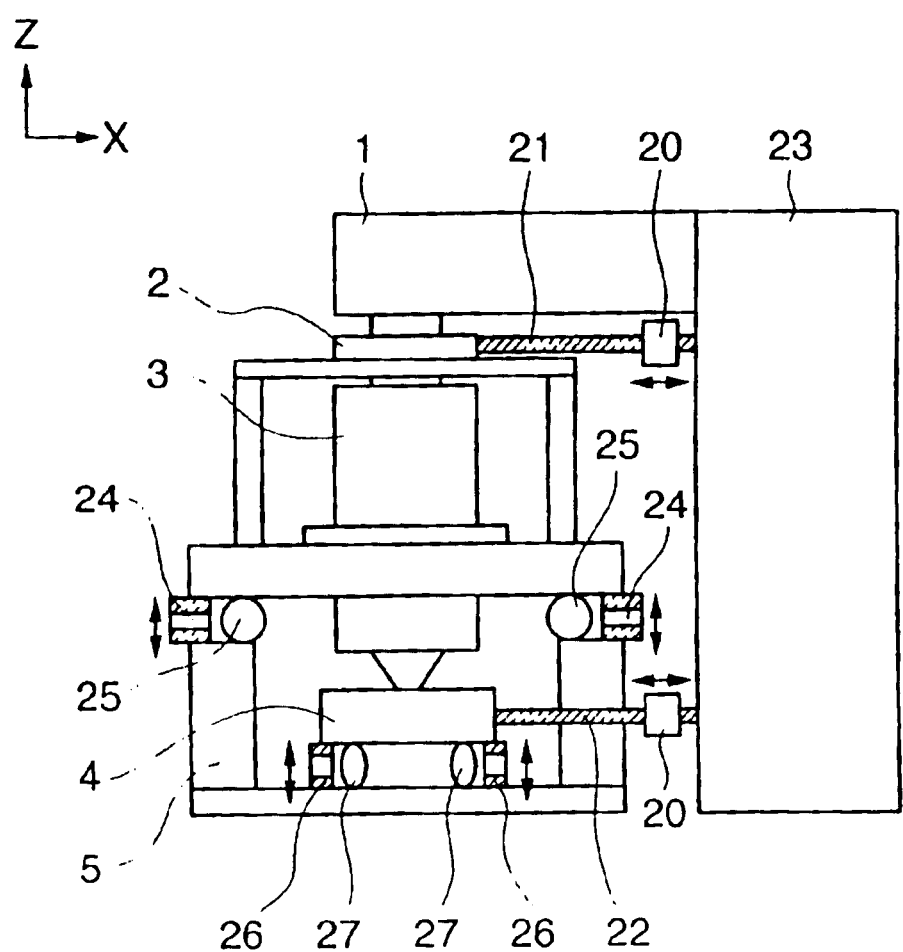
FIG. 14 is a schematic view for explaining an entire exposure apparatus according to the second embodiment.

FIG. 14 is a view showing an entire exposure apparatus according to the second embodiment. In FIG. 14, reference numeral 1 denotes an illumination system unit having an exposure light source and a function of shaping exposure light and irradiating a reticle; 2, a reticle stage, which supports a reticle and scans the reticle with respect to a wafer at a predetermined exposure reduction ratio to the wafer; 3, a reduction projection lens of a projection optical system for reducing and projecting a master pattern onto a wafer; 4, a wafer stage for sequentially moving a wafer every exposure; and 5, an exposure apparatus main body, which supports the reticle stage 2, projection lens 3, and wafer stage 4.

A linear motor reaction force in scan of the reticle stage 2 is transmitted to a chamber machine room 23 via a reticle stage reaction force receiver 21 so as not to transmit the reaction force to the exposure apparatus main body 5. A single-phase linear motor 20 is arranged at the middle of the reticle stage reaction force receiver 21 in order to mechanically separate the exposure apparatus main body 5 from the chamber machine room 23 and to cut off transmission of vibrations. The single-phase linear motor 20 functions as a force actuator, causes only a reaction force component to escape to the chamber machine room 23, and prevents a decrease in exposure precision caused by the reaction force transmitted to the exposure apparatus main body 5.

A linear motor reaction force in scan of the wafer stage 4 is transmitted to the chamber machine room 23 via a wafer stage reaction force receiver 22 so as not to transmit the reaction force to the exposure apparatus main body 5. A single-phase linear motor 20 is arranged at the middle of the wafer stage reaction force receiver 22 in order to mechanically separate the exposure apparatus main body 5 from the chamber machine room 23 and to cut off transmission of vibrations. The single-phase linear motor 20 functions as a force actuator, causes only a reaction force component to escape to the chamber machine room 23, and prevents a decrease in exposure precision caused by the reaction force transmitted to the exposure apparatus main body 5.

That is, the driving reaction forces generated upon driving the stages (2, 4) are canceled by the forces generated by controlling the single-phase linear motors 20. The reaction force components generated by controlling the single-phase linear motors 20 are transmitted to the chamber machine room 23, and the energy caused by the reaction force components is released.

The upper side of the exposure apparatus main body 5 that supports the reduction projection lens 3 is separated from floor vibrations and the reaction force of the wafer stage 4. For this purpose, single-phase linear motors 24 are arranged parallel to the main body air mounts 25 in order to improve a damping characteristic against a high frequency component when the reduction projection lens 3 is supported via the main body air mounts 25. The single-phase linear motors 24 improve the damping performance against vibrations from the floor and wafer stage 4.

The wafer stage 4 is separated from vibrations from the floor. For this purpose, single-phase linear motors 26 are arranged parallel to stage air mounts 27 in order to improve the damping characteristic against a high frequency component when the wafer stage 4 is supported via the main body air mounts 27. The single-phase linear motors 26 improve the damping performance against vibrations from the floor.

Figure 15A:
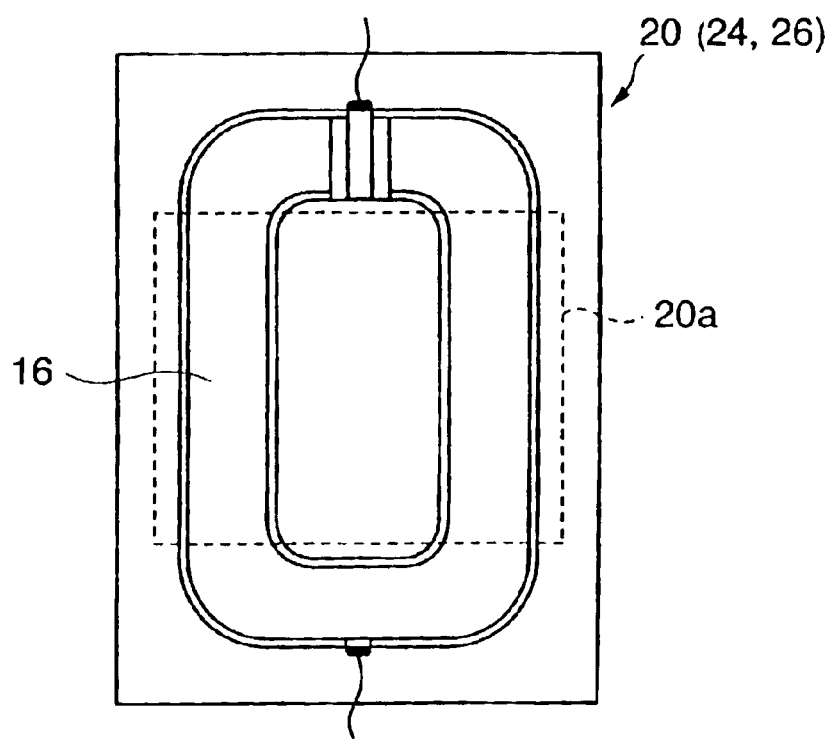
FIG. 15A is a plan view for explaining a single-phase linear motor according to the second embodiment.
Figure 15B:
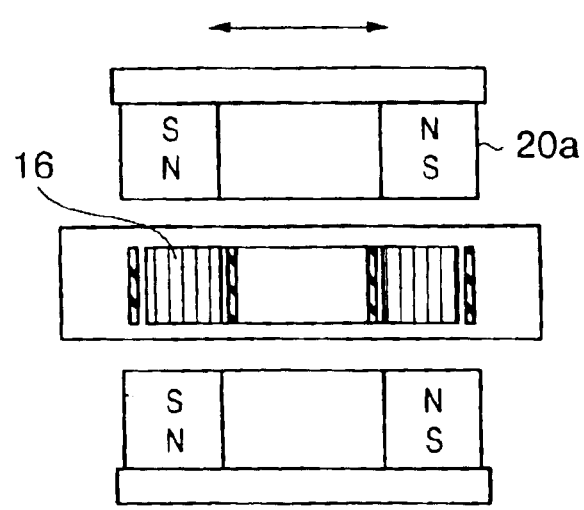
FIG. 15B is a side view when viewed from a direction indicated by the arrow in FIG. 15A.

In an application using the above arrangement, each of the single-phase linear motors 20, 24, and 26 is realized by one coil 16 as a stationary coil prepared by winding a foil coil 16a in a multilayered structure, as shown in FIGS. 15A and 15B. Movable magnets 20A are laid out in a magnetized pattern shown in FIG. 15B. This can implement a single-phase linear motor with small heat generation, i.e., low power consumption.

Third Embodiment

The third embodiment of the present invention will be described with reference to FIGS. 7A to 7D and 8A to 8D. FIGS. 7A to 7D are views showing a linear motor coil according to the third embodiment of the present invention. The structures of an exposure apparatus and a linear motor in the following embodiments are the same as those described in the first or second embodiment.

Figure 7A:
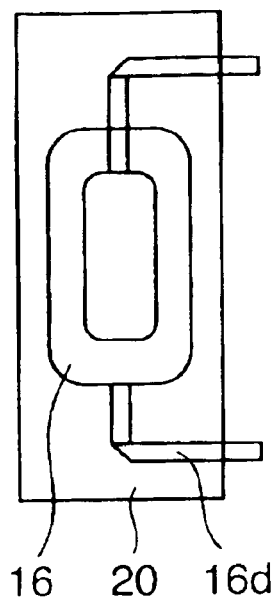
FIGS. 7A to 7D are plan views for explaining a method of extracting the lead line of the coil according to the third embodiment.
Figure 7B:
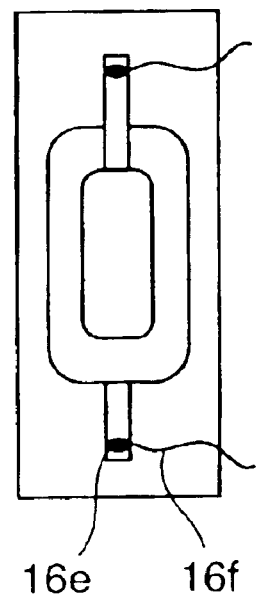
Figure 7C:
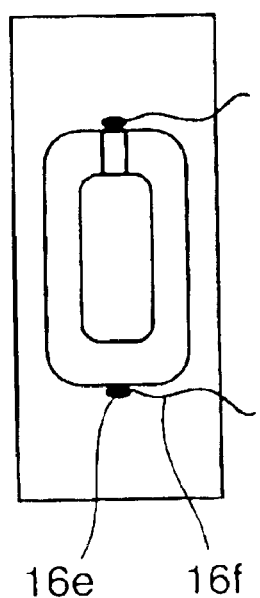
Figure 19A:
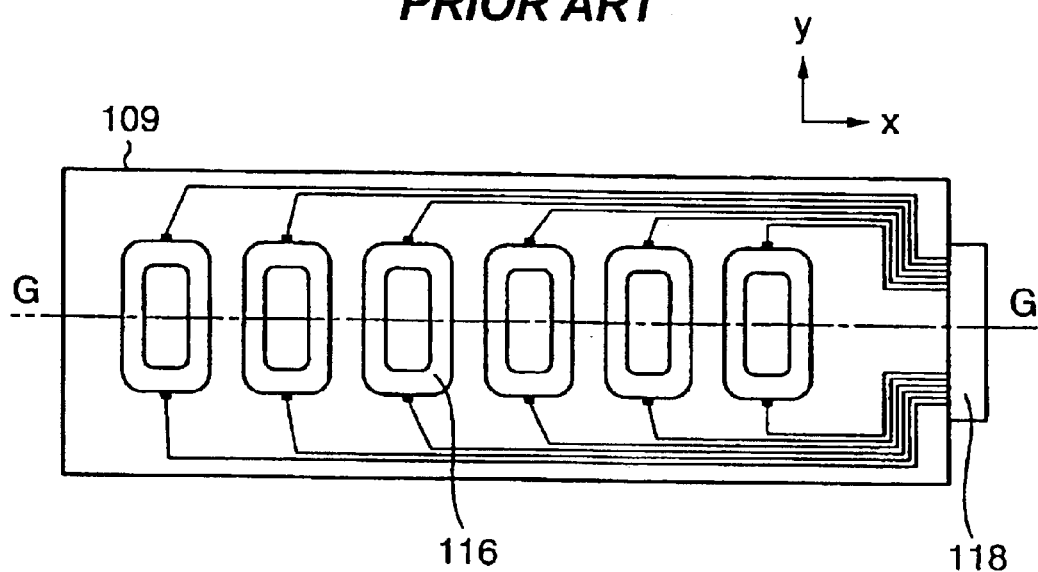
FIG. 19A is a plan view showing a conventional linear motor when viewed from the top.
Figure 19B:
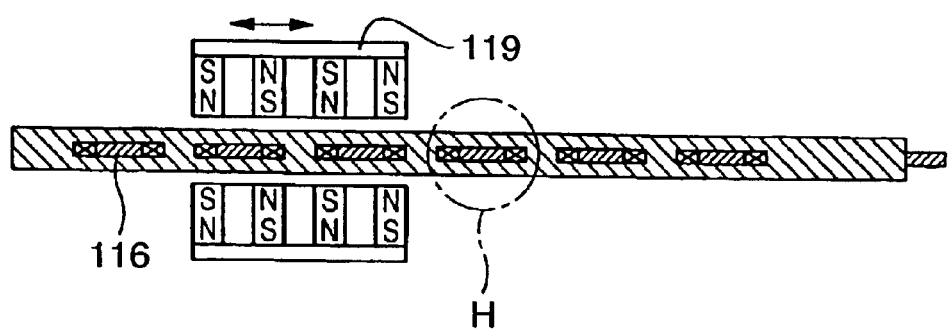
FIG. 19B is a sectional view taken along the line G—G in FIG. 19A.
Figure 20:
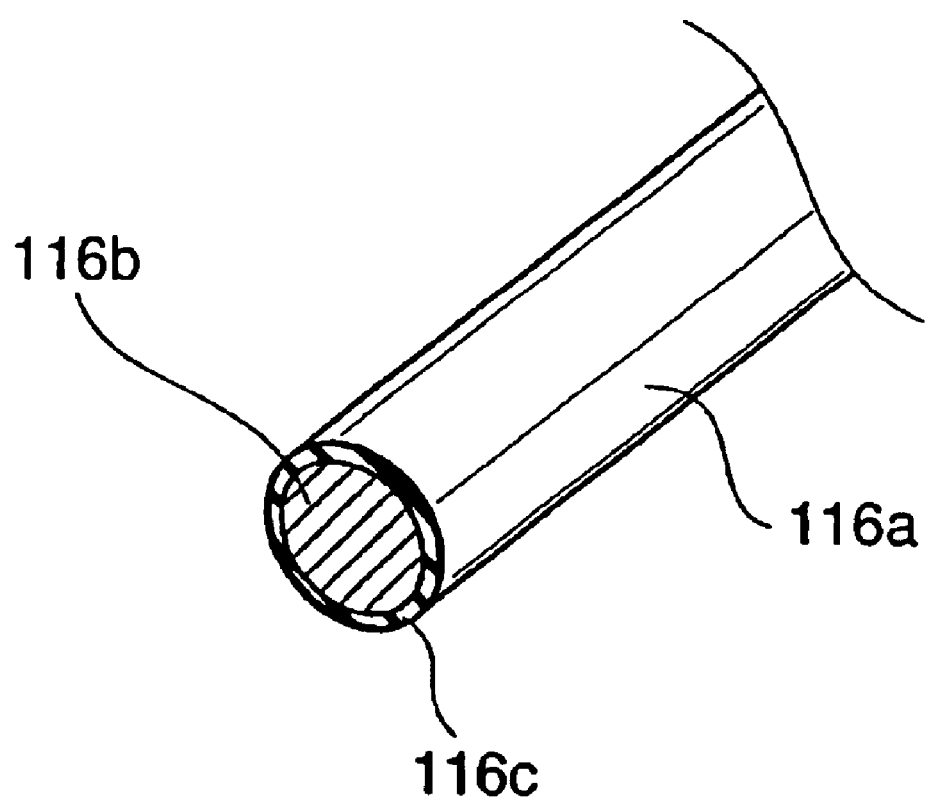
FIG. 20 is a perspective view for explaining a conventional round wire coil.
Figure 21:
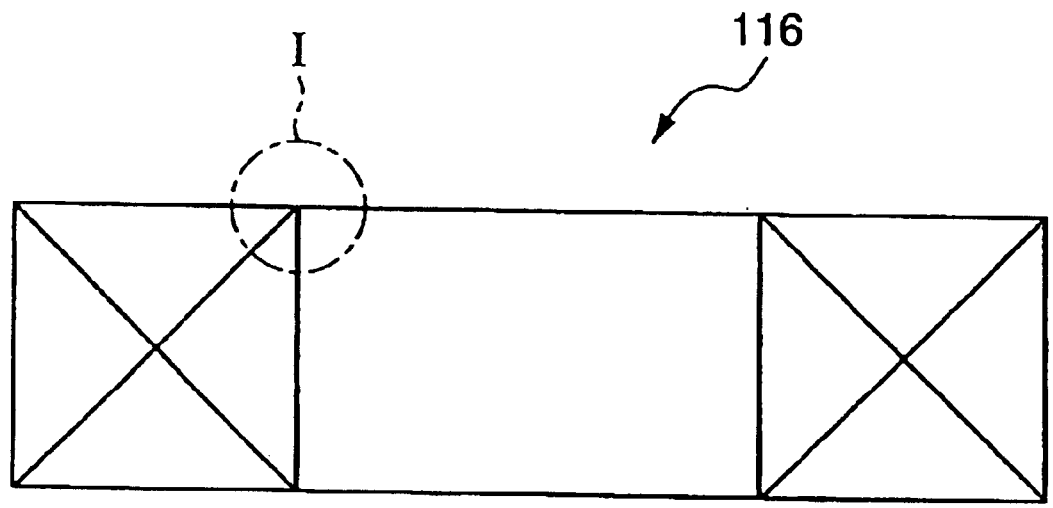
FIG. 21 is an enlarged, sectional view showing a portion H in FIG. 19B.
Figure 22:
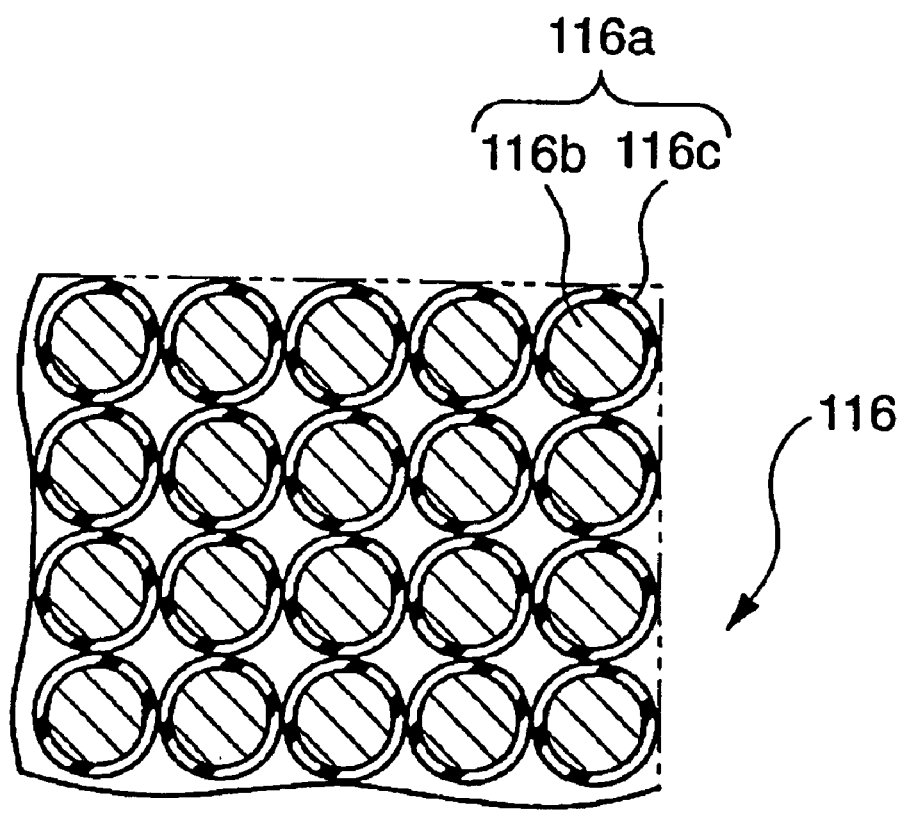
FIG. 22 is an enlarged, sectional view showing a portion I in FIG. 21.

In the first embodiment, a lead line 16f is soldered on the outer circumferential surface of the coil 16, as shown in FIG. 7C. Alternatively, as shown in FIG. 7A, the foil coil of the coil 16 can be extracted from the main body of the coil 16 and connected to a relay substrate (17 in FIG. 3A), a linear motor terminal, or a connector (118 in FIG. 19A) without any mediacy.

It is also possible, as shown in FIG. 7B, to extract the foil coil of the coil 16 from the main body of the coil 16, to connect the foil coil to the lead line 16f via solder 16e at the middle of the foil coil, and to connect the lead line 16f to a linear motor terminal or connector.

Figure 7D:
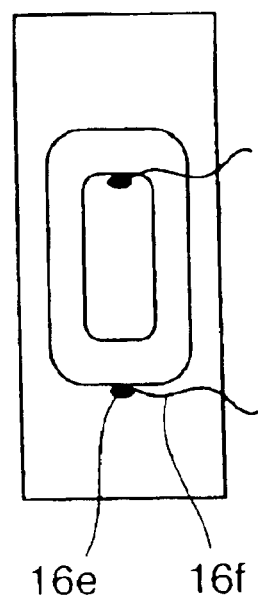
Figure 8A:
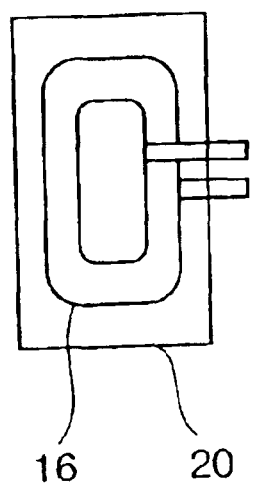
FIGS. 8A to 8D are plan views for explaining another method of extracting the lead line of a coil according to the third embodiment.
Figure 8B:
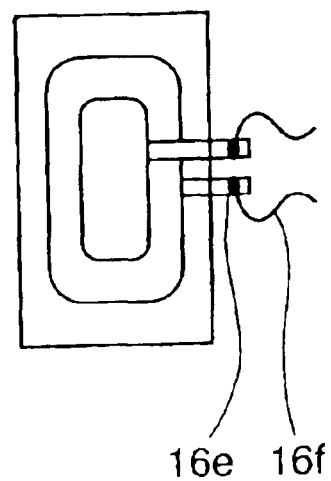
Figure 8C:
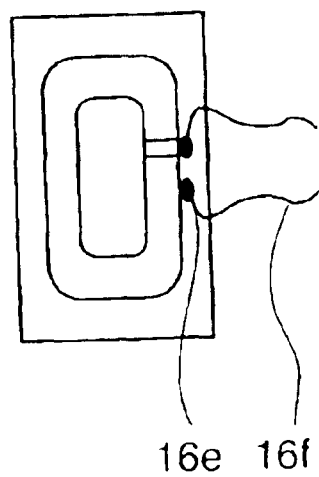
Figure 8D:
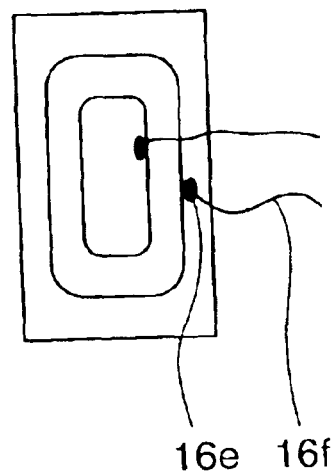

It is also possible, as shown in FIG. 7D, to solder (16e) the lead line 16f at a winding start and end (inner and outer ends) on the inner and outer circumferential surfaces of the coil 16, to extract the lead line from the coil main body, and to connect the lead line to a linear motor terminal or connector.

A lead line can also be extracted in the longitudinal direction of the coil 16, i.e., from an effective driving portion, as shown in FIGS. 8A to 8D.

Fourth Embodiment

The fourth embodiment of the present invention will be described with reference to FIGS. 9A to 9C and 10A to 10C.

Figure 9A:
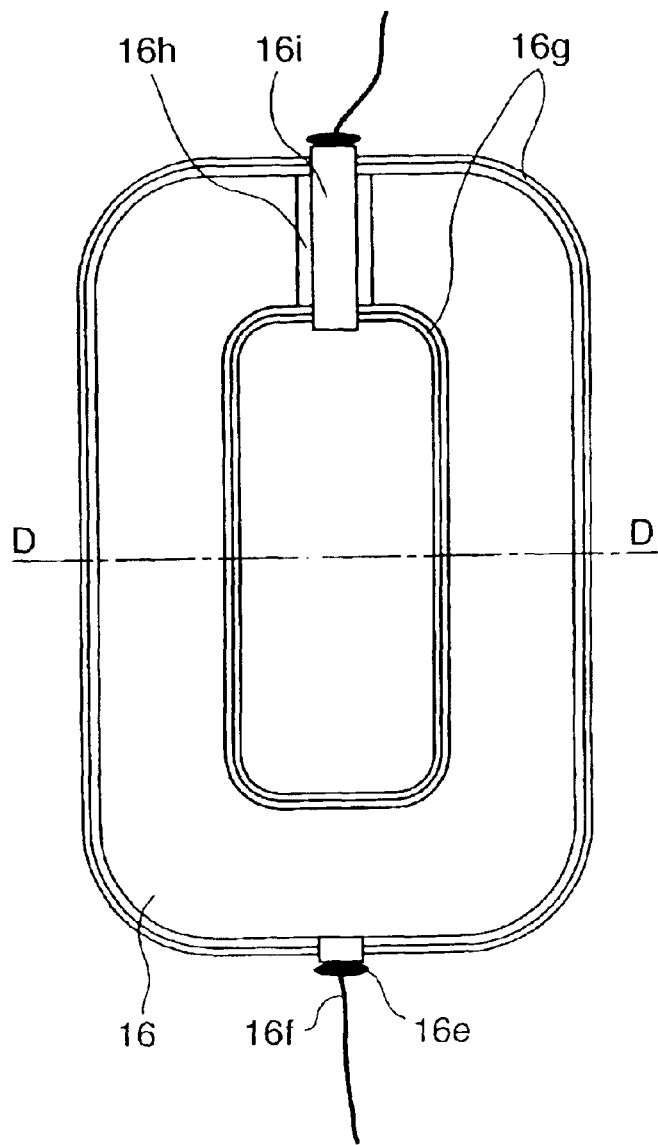
FIG. 9A is a plan view showing a coil according to the fourth embodiment.
Figure 9B:
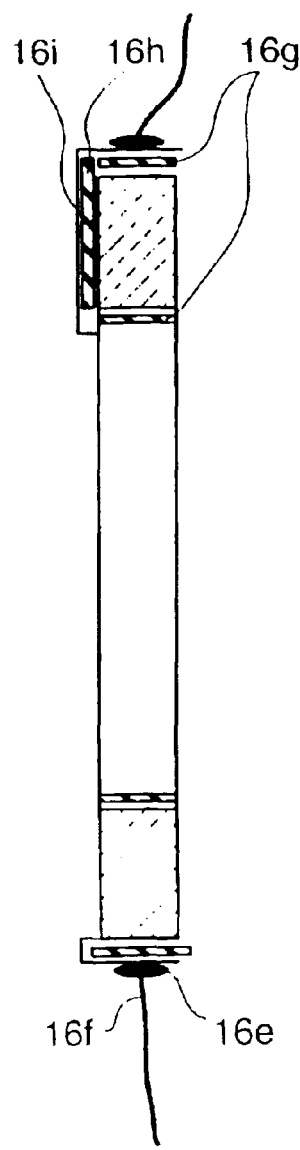
FIG. 9B is a side view of FIG. 9A.
Figure 9C:
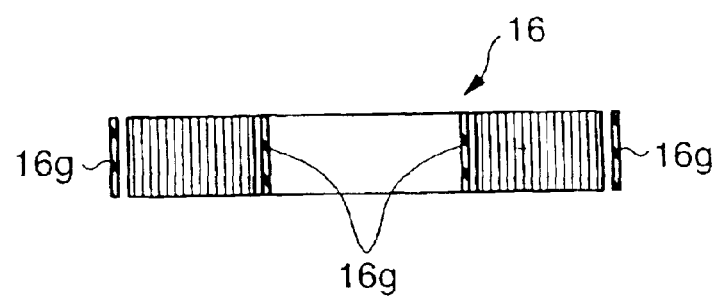
FIG. 9C is a sectional view taken along the line D—D in FIG. 9A.
Figure 10A:
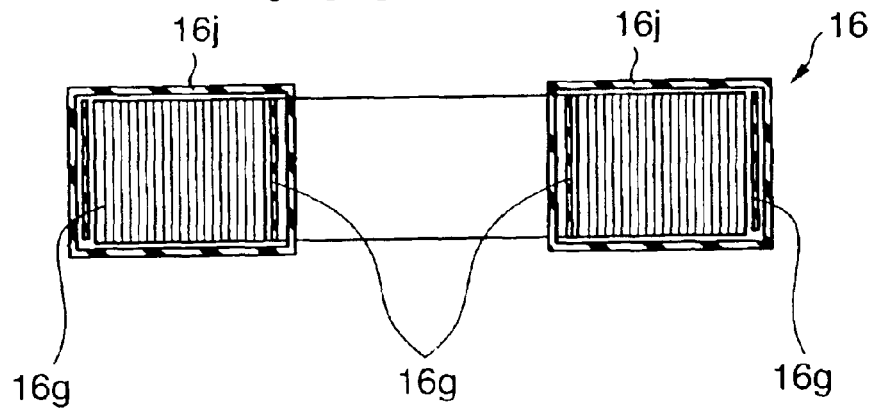
FIGS. 10A to 10C are sectional views for explaining a coil insulation method according to the fourth embodiment.

FIGS. 9A to 9C and 10A to 10C are views showing a linear motor coil according to the fourth embodiment. FIG. 9A is a plan view of the coil, FIG. 9B is a side view of FIG. 9A, and FIG. 9C is a sectional view taken along the line D—D in FIG. 9A. Insulating films 16g are wound on the inner and outer circumferential surfaces of a coil 16. Insulating films 16h as an insulator are inserted between the side surfaces (upper and lower surfaces in the sectional view taken along the line D—D) of the main body of the coil 16 and a portion (foil coil inner circumferential surface extraction portion 16i) where the inner end of the coil 16 is extracted to the outside. Further, as shown in FIG. 10A, an insulating coat 16*j* of a polyurethane resin or epoxy resin is applied to the entire outer circumferential surface of the coil 16. This compensates for electrical insulation at all the exposed portions of the coil 16.

Figure 10B:
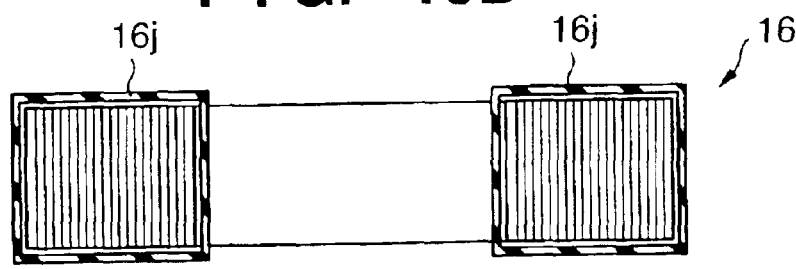

Alternatively, as shown in FIG. 10B, the insulating coat 16*j* can be so applied as to directly cover all the exposed portions of the coil 16 without any insulating films on the inner and outer circumferential surfaces of the coil.

Figure 10C:
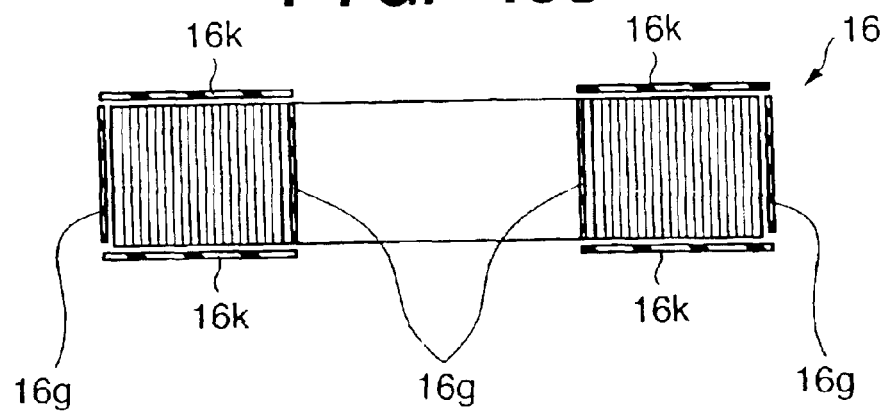

Alternatively, as shown in FIG. 10C, the insulating film 16*g* and an insulating film 16*k* are adhered to or wound around all the exposed portions of the inner and outer circumferential surfaces of the coil and all the exposed portions of the upper and lower surfaces of the coil. This compensates for electrical insulation at all the exposed portions of the coil 16.

Fifth Embodiment

Figure 11A:
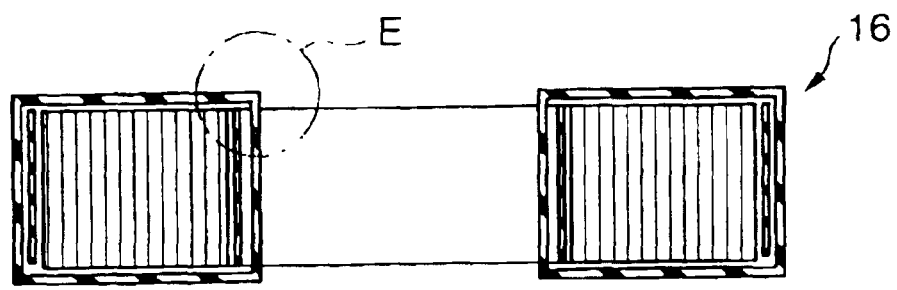
FIG. 11A is a sectional view for explaining a coil insulation method according to the fifth embodiment.
Figure 11B:
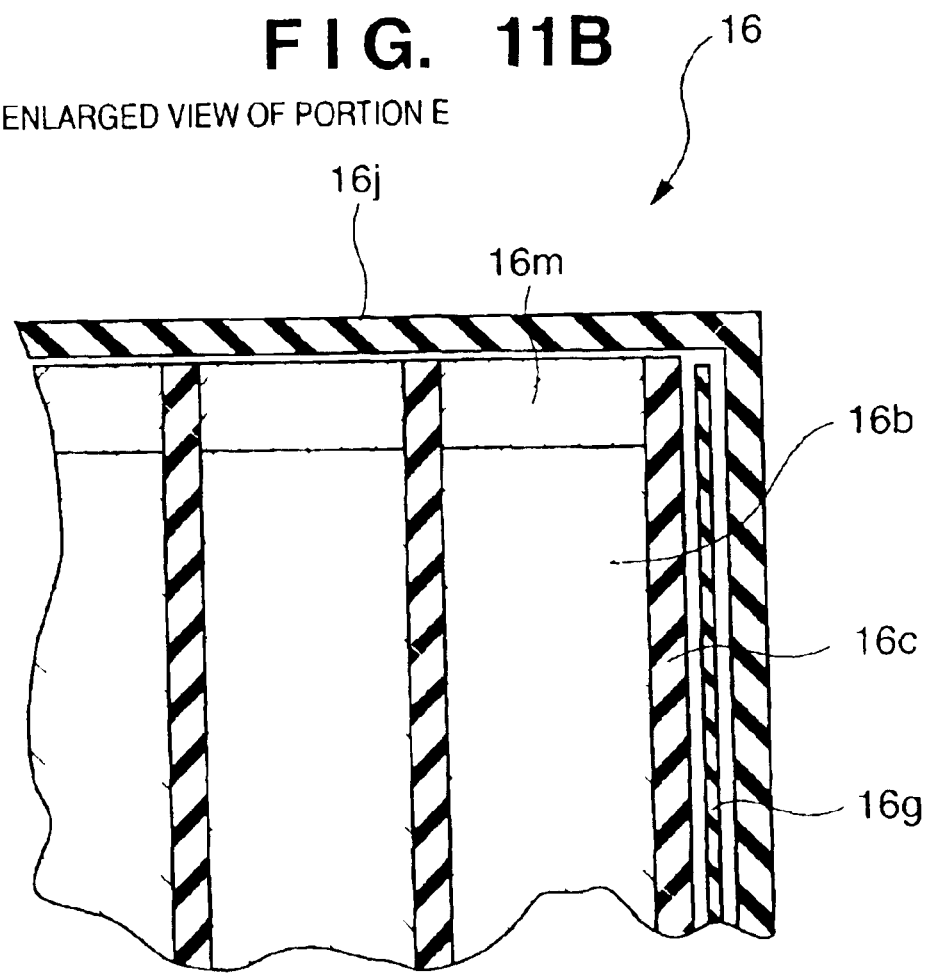
FIG. 11B is an enlarged, sectional view showing a portion E in FIG. 11A.
Figure 12A:
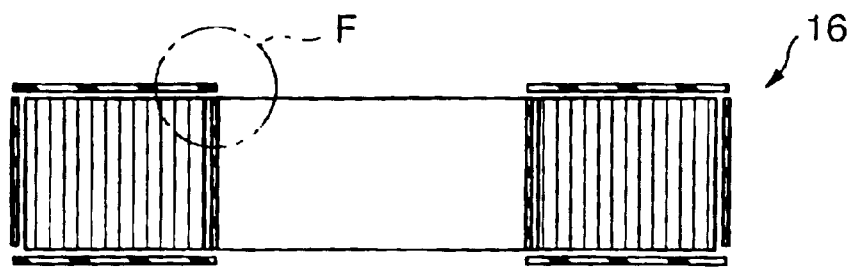
FIG. 12A is a sectional view for explaining another coil insulation method according to the fifth embodiment.
Figure 12B:
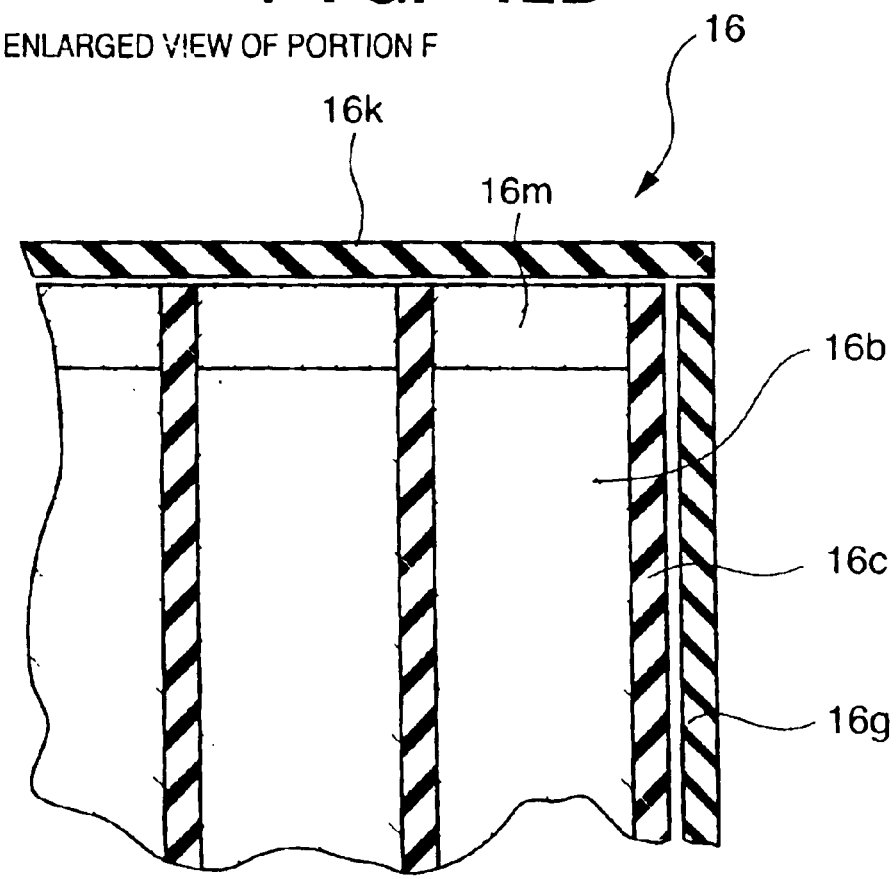
FIG. 12B is an enlarged, sectional view showing a portion F in FIG. 12A.

The fifth embodiment of the present invention will be described with reference to FIGS. 11A, 11B, 12A and 12B. As shown in FIG. 11B, which is an enlarged view of a portion E in FIG. 11A, the side end of a copper foil 16*b* is oxidized to form an oxide film 16*m*. The oxide film 16*m* provides electrical insulating properties, which can prevent a rare short circuit between the ends of adjacent foil coil layers. Insulating films 16*g* are wound on the inner and outer circumferential surfaces of a coil 16, and the outer circumferential surface is entirely coated with an insulating coat 16*j*, thus compensating for electrical insulation at all the exposed portions of the coil 16. shown in FIG. 12A and FIG. 12B, which is an enlarged view of a portion F shown in FIG. 12A, oxidization processing at the end of the copper foil 16*b*, and insulating films 16*g* and 16*k* can also be combined.

Insulation can also be attained between adjacent foil layers by similarly forming an oxide film at the side edge when the conductor layer of the foil coil is formed from an aluminum foil, copper-aluminum allow foil, silver foil, or gold foil other than the copper foil 16*b*.

Sixth Embodiment

The sixth embodiment of the present invention will be described with reference to FIGS. 13A to 13C.

Figure 13A:
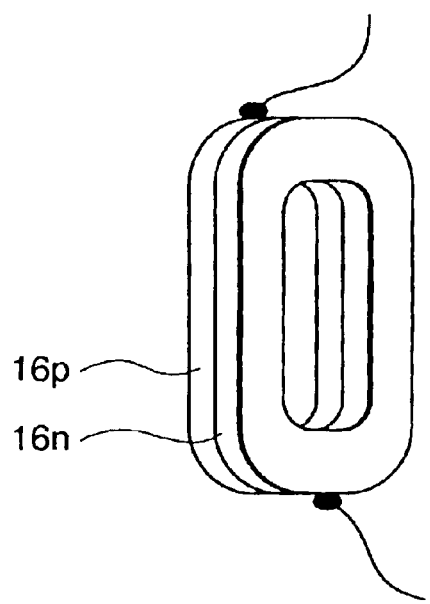
FIGS. 13A to 13C are perspective views showing the juxtaposed structure of a coil according to the sixth embodiment.
Figure 13B:
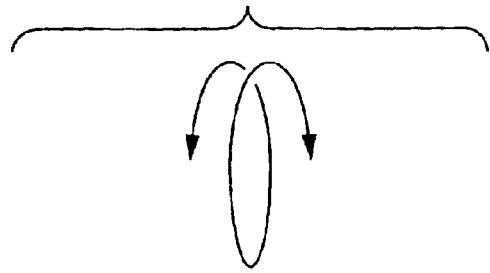
Figure 13B:
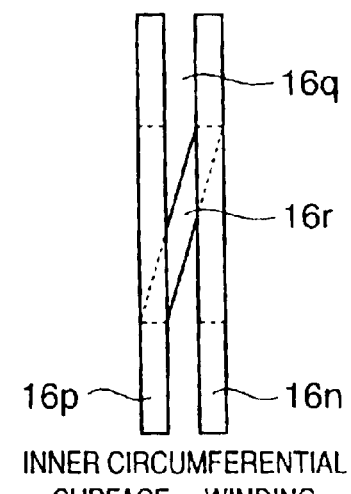
Figure 13C:
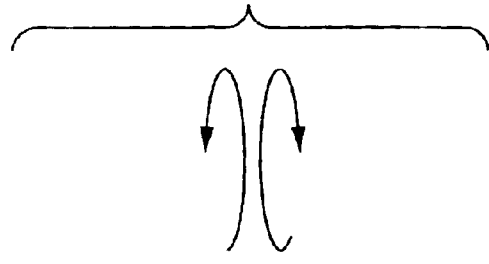
Figure 13C:
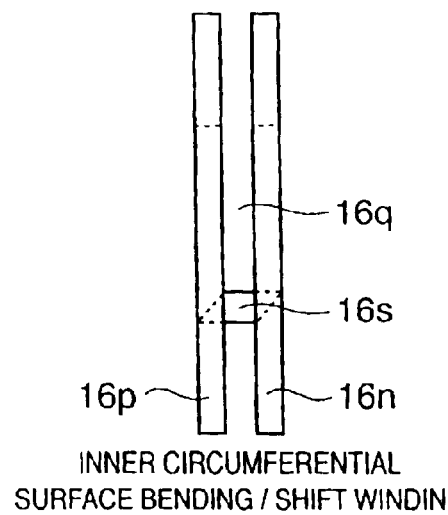

FIGS. 13A to 13C are views showing a linear motor coil according to the sixth embodiment. As shown in FIG. 13A, a coil is constituted with a juxtaposed structure in which first and second coils 16*n* and 16*p* as the above-described partial coils are spaced apart from each other or stacked on each other in the gap direction of a magnetic circuit. At this time, as shown in FIG. 13B, the inner circumferential surfaces of the two coils are wound in an a shape (spiral shape) to form a coupling portion 16*r*. The first and second coil 16*n* and 16*p* made of a continuous foil coil can be seamlessly wound with a gap 16*q* so as to make their current application/rotation directions coincide with each other. With the juxtaposed structure of the two coils, a coolant can flow through the gap 16*q*. This increases the coil cooling efficiency and the driving current margin, obtaining a linear motor excellent in thermal characteristics. in constituting a coil with the juxtaposed structure of the first and second coils 16*n* and 16*p*, the inner circumferential surfaces of the two coils are bent twice at almost right angles to form a coupling portion 16*s* by inner circumferential surface bending/shift winding, as shown in FIG. 13C. The first and second coils 16*n* and 16*p* made of a continuous foil can be seamlessly wound with the gap 16*q* so as to make their current application/rotation directions coincide with each other.

Seventh Embodiment

Figure 16A:
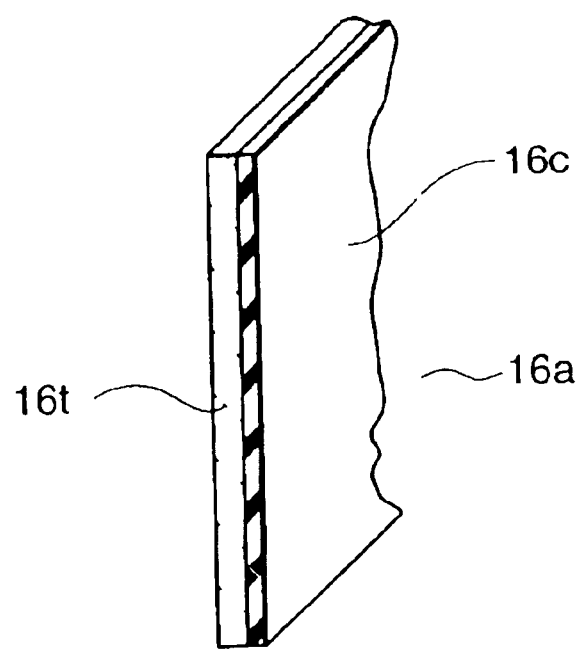
FIGS. 16A and 16B are perspective views for explaining a foil coil according to the seventh embodiment.
Figure 16B:
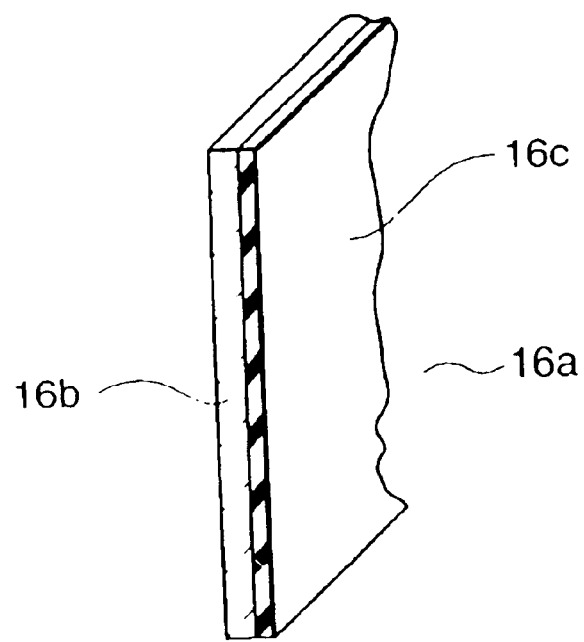

The seventh embodiment will be described with reference to FIGS. 16A and 16B. As shown in FIG. 16A, an aluminum foil 16*t* can replace the copper foil as the conductor layer of the foil coil. Alternatively, as shown in FIG. 16B, acopper-aluminum allow foil 16*u* can also replace the copper foil. Furthermore, a conductor foil of gold or silver can also be used.

Eighth Embodiment

The eighth embodiment of the present invention will be described with reference to FIGS. 23A to 30.

Figure 23A:
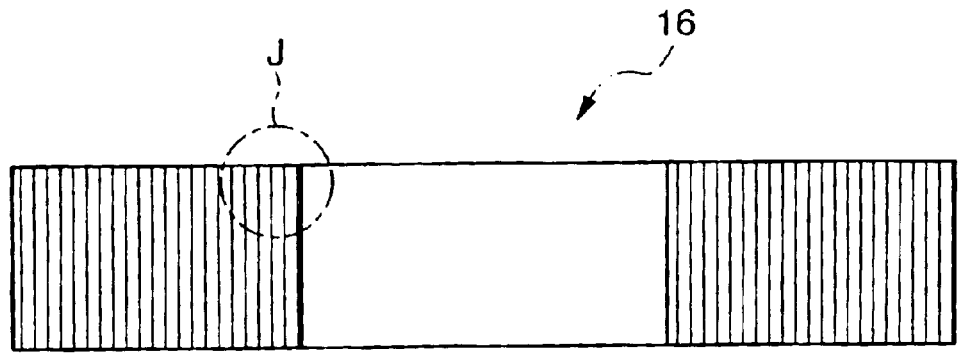
FIG. 23A is sectional view showing a coil according to the eighth embodiment.
Figure 23B:
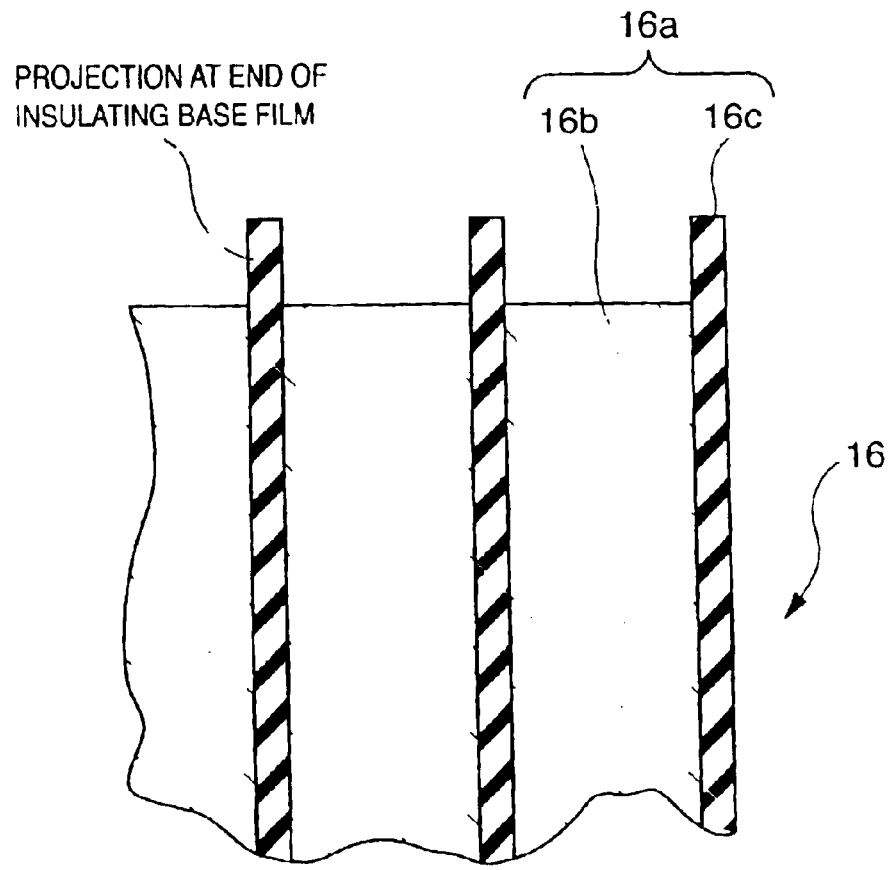
FIG. 23B is an enlarged sectional view showing a portion J in FIG. 23A.

FIGS. 23A and 23B show the state wherein the foil coil according to the eighth embodiment is wound. A coil 16 is constituted such that a band-like foil coil 16*a* prepared by adhering a copper foil 16*b* to an insulating base film 16*c* is wound in a multilayered structure around a hollow coil into a sectional shape shown in FIG. 23A. As shown in FIG. 23B, which is an enlarged view of a portion J shown in FIG. 23A, the foil coil 16*a* is continuously wound in a multilayered aligned state, and the insulating base film 16*c* is slightly wider than the copper foil 16*b*. Thus, the coil 16 is formed with projections at the end of the insulating base 16*c*, as shown in FIG. 23B. This coil 16 constitutes the stationary coil of an X linear motor 9.

The copper foil 16B can be processed by processes as shown in FIGS. 24A to 24D in order to make it shallower than the insulating base film 16*c*.

Figure 24A:
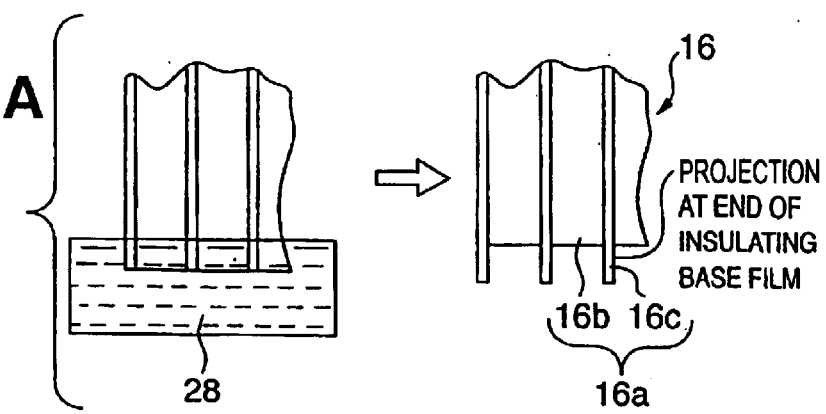
FIGS. 24A to 24D are views for explaining a coil-side end processing method according to the eighth embodiment.

The method shown in FIG. 24A is an etching process. After the foil coil 16*a* is wound in multilayered structure around a hollow coil, the side end of the foil coil 16*a* is dipped into an etching solution 28 to etch away only the copper foil 16*b*. As shown in FIG. 24A, the width of the copper foil 16*b* becomes smaller than that of the insulating base film 16*c*.

Figure 24B:
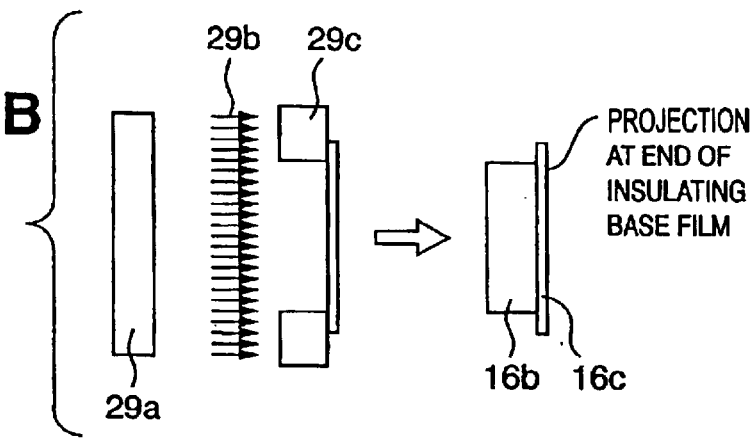

The method shown in FIG. 24B is a sputtering process in which the cooper foil 16*b* and insulating base film 16*c* are adhered to each other. According to this method, plasma discharge generated by an electrical or magnetic field is applied to a target material (copper) 29*a* in vacuum. Gas ions are accelerated by the electrical field to attack the target material (copper) 29*a*. By this collision energy, sputtered copper atoms 29*b* of the target material (copper) 29*a* move to the surface of the insulating base film 16*c*. Copper atoms are stacked by sputtering to form the copper foil 16*b*. At this time, a mask 29*c* is set at a position where it shields the copper atoms 29*b* so as to attain a slightly smaller width than that of the insulating base film 16*c*. As a result, the width of the copper foil 16*b* is made smaller. After that, the foil coil 16*a* is wound in a multilayered structure to form the coil 16.

Figure 24C:
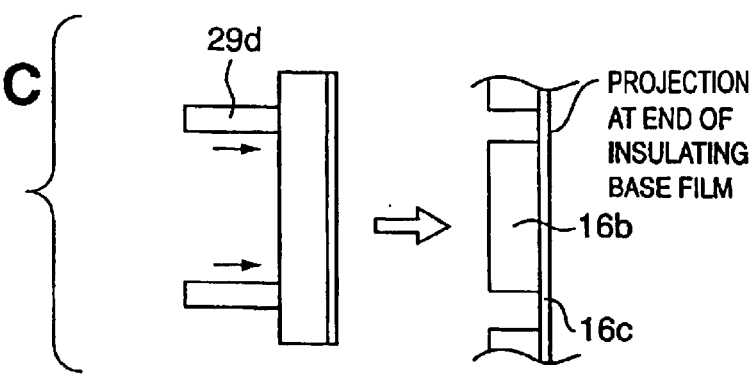

The method shown in FIG. 24C is a grinding process after the copper foil 16*b* and insulating base film are adhered to each other. A grindstone 29*d* as shown in FIG. 24C is moved in press contact with the copper foil 16*b*, grinding the copper foil 16*b*. The width of the copper foil 16*b* finally becomes smaller than that of the insulating base film 16*c*, as shown in FIG. 24C. The unnecessary portion of the copper foil 16*b* is removed, or the copper foil 16*b* is cut at the center of a projection at the end of the insulating base film 16*c*, thereby forming the foil coil 16*a*. The foil coil 16*a* is wound in a multilayered structure to form the coil 16.

Figure 24D:
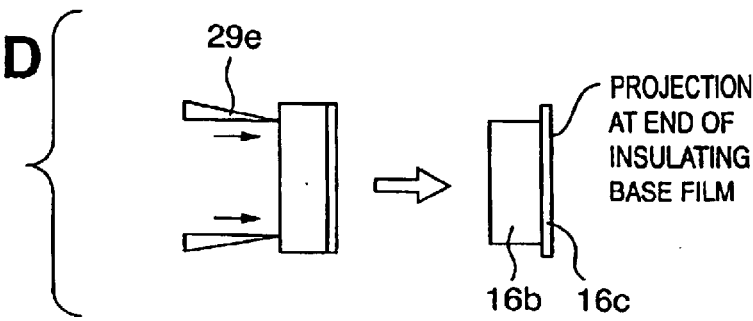

The method shown in FIG. 24D is a cutting process after the copper foil 16*b* and insulating base film are adhered to each other. A cutter 29*e* as shown in FIG. 24D is moved in press contact with the copper foil 16*b*, cutting the copper foil 16*b*. The width of the copper foil 16*b* finally becomes smaller than that of the insulating base film 16*c*, as shown in FIG. 24D. At this time, only the copper foil 16*b* can be efficiently cut away by using a discharge cutter or the like as the cutter 29*e* instead of a general carbide cutter.

Insulation processes on the outer circumferential surface of the coil according to the eighth embodiment can be done by the same method as that of the fourth embodiment shown in FIGS. 9A to 9C and 10A to 10C.

Figure 25A:
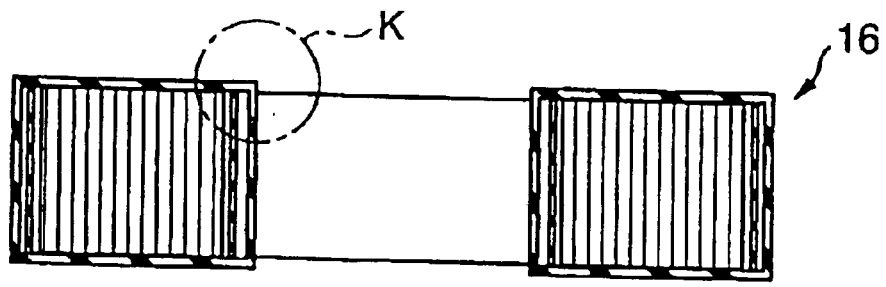
FIG. 25A is a sectional view for explaining a coil insulating method according to the eighth embodiment.
Figure 25B:
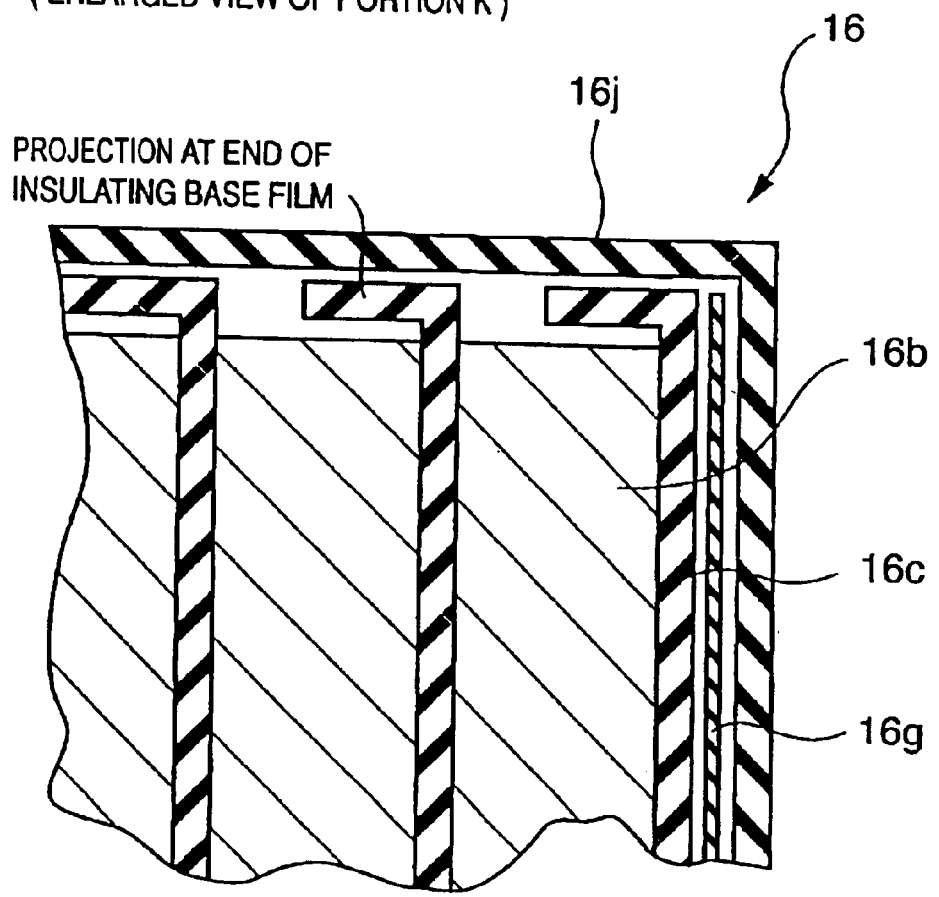
FIG. 25B is an enlarged, sectional view showing a portion K in FIG. 25A.

In this case, a rare short circuit can be prevented between adjacent edges of adjacent layers of the copper foil 16b by bending projections at the end of the insulating base film 16c, as shown in FIG. 25B, which is an enlarged view of a portion K in FIG. 25A. Insulating films 16g are wound on the inner and outer circumferential surfaces of the coil 16, and the entire outer circumferential surface is coated with an insulating coat 16j. This compensates for electrical insulation at all the exposed portions of the coil 16.

Figure 26A:
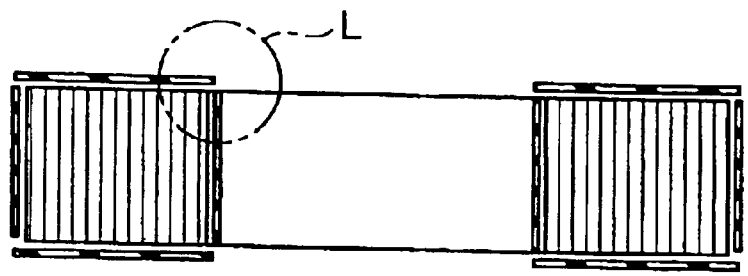
FIG. 26A is a sectional view for explaining another coil insulating method according to the eighth embodiment.
Figure 26B:
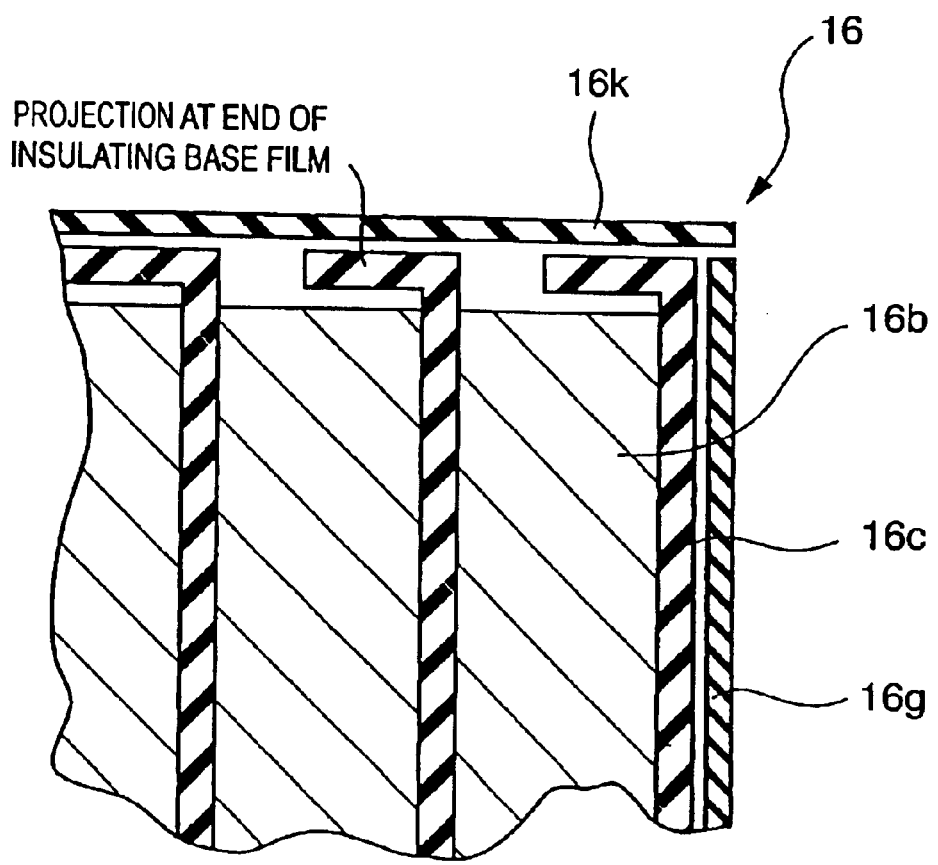
FIG. 26B is an enlarged, sectional view showing a portion L in FIG. 26A.

Further, a rare short circuit can be prevented between adjacent edges of adjacent layers of the copper foil 16b by bending projections at the end of the insulating base film 16c, as shown in FIG. 26B, which is an enlarged view of a portion L shown in FIG. 26A. Insulating films 16g and 16k are adhered to the inner and outer circumferential surfaces of the coil 16 and the upper and lower surfaces (side surfaces) thereof. This compensates for electrical insulation at all the exposed portions of the coil 16.

Figure 27A:
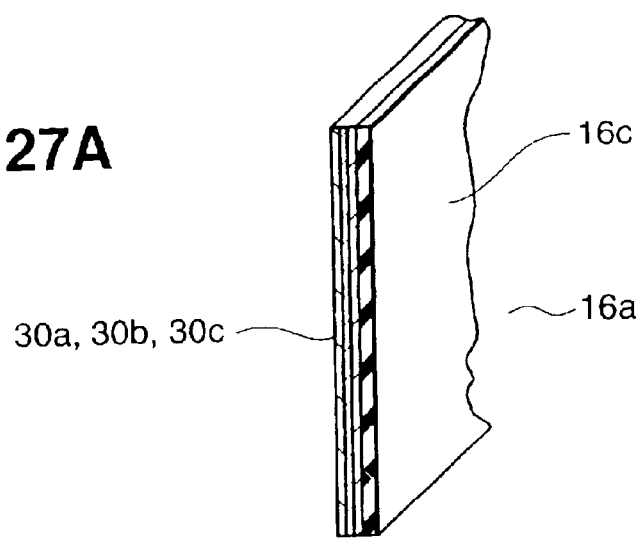
FIGS. 27A to 27C are a perspective view for explaining the structure of a foil coil according to the eighth embodiment, a sectional view for explaining the effect, and a perspective view for explaining another structure of the foil coil, respectively.
Figure 27B:
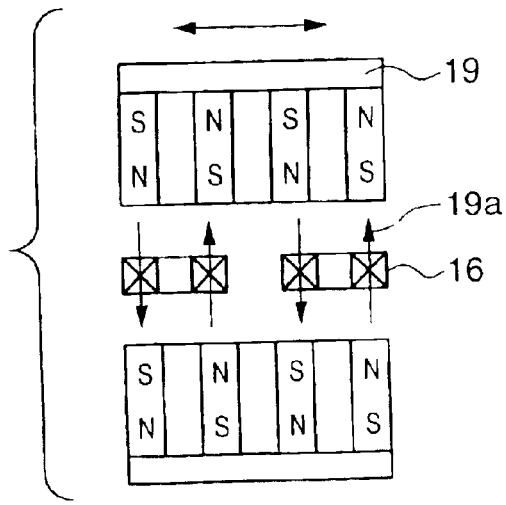
Figure 27C:
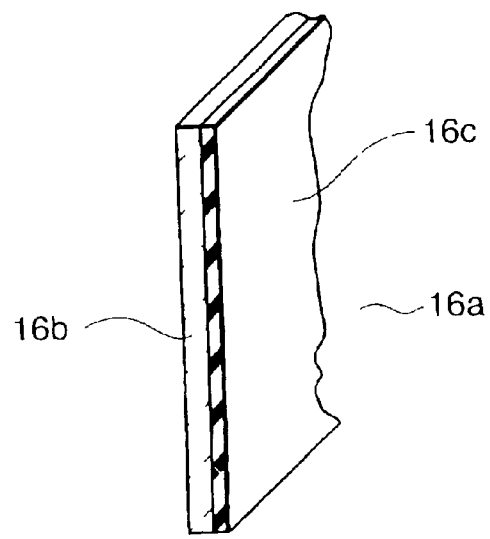

If the conductor foil uses a high-permeability material such as a permalloy foil 30a, a ferrite alloy foil 30b, or an Ni alloy foil 30c, as shown in FIG. 27A, the density of a gap magnetic flux 19a of a movable magnet 19 can be increased in comparison with a conventional copper wire, resulting in higher linear motor efficiency, as shown in FIG. 27B.

If the insulating base film 16c uses a paraffin-based fully aromatic polyamide fiber or resin higher in rigidity than a general polyester- or polyimide-based base film, the coil rigidity after the foil coil 16a is wound can be increased.

As shown in FIGS. 28A and 28B, the conductor material may be a cladding foil material 30d prepared by adhering different types of conductors. In this embodiment, the cladding foil material 30d is made up of an aluminum foil 30f and a copper foil 30e. This structure can implement a lightweight coil 16 without increasing the resistance.

If the insulating base film 16c is designed wider than the cladding foil material 30d, as shown in FIG. 28c, a short circuit can be prevented between adjacent layers of the cladding foil material 30d by bending the insulating base film 16c at its end face, as shown in FIGS. 25A, 25B, 26A, and 26B.

Figure 29A:
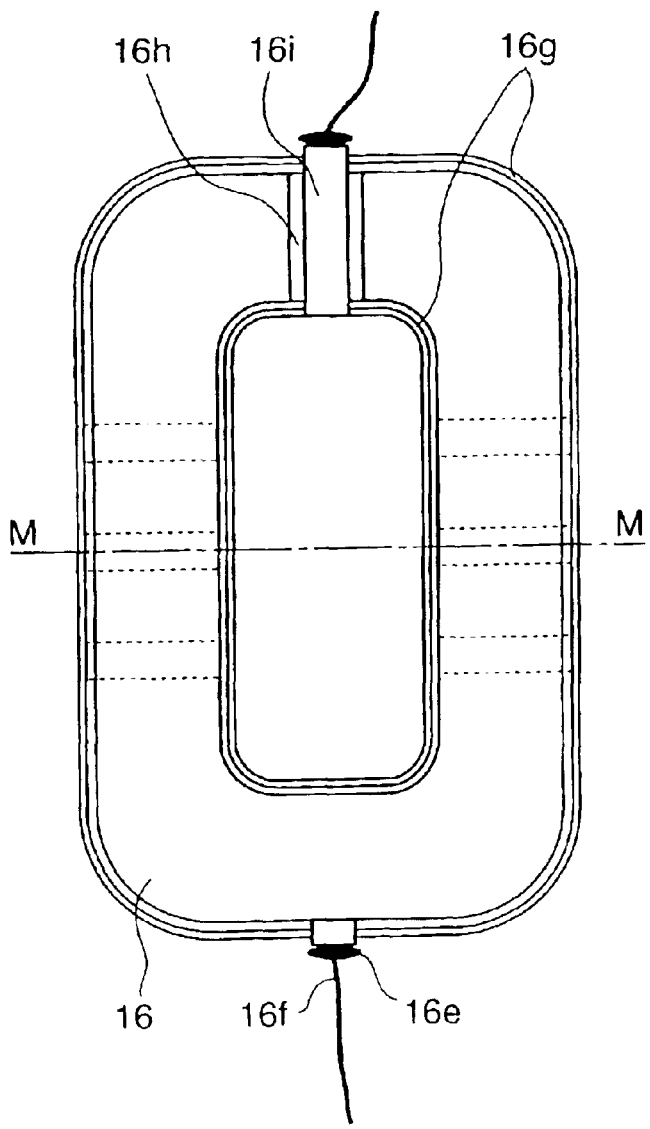
FIG. 29A is a plan view showing another coil according to the eighth embodiment.
Figure 29B:
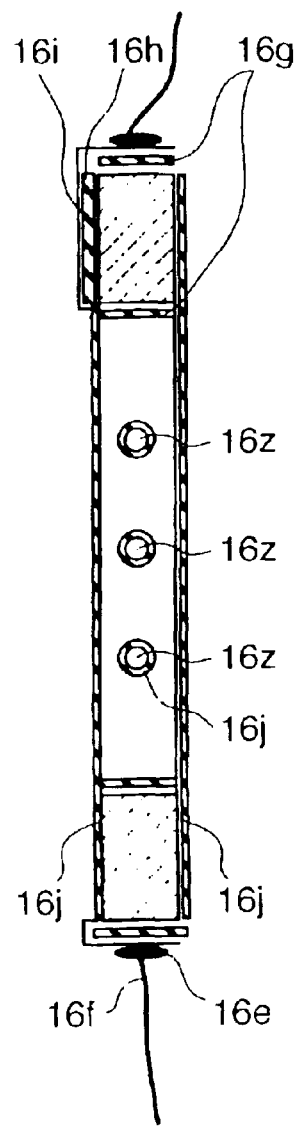
FIG. 29B is a side view of FIG. 29A.
Figure 29C:
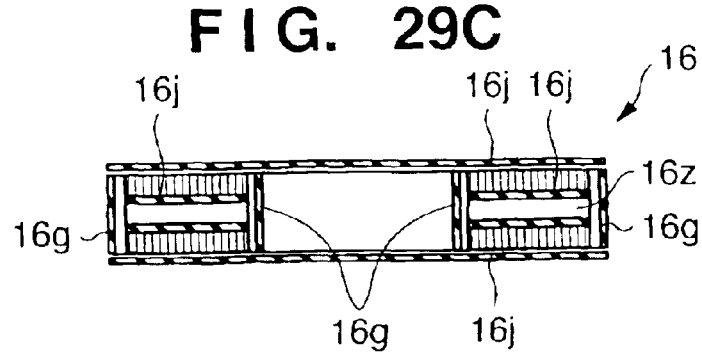
FIG. 29C is a sectional view taken along the line M—M in FIG. 29A.
Figure 30:
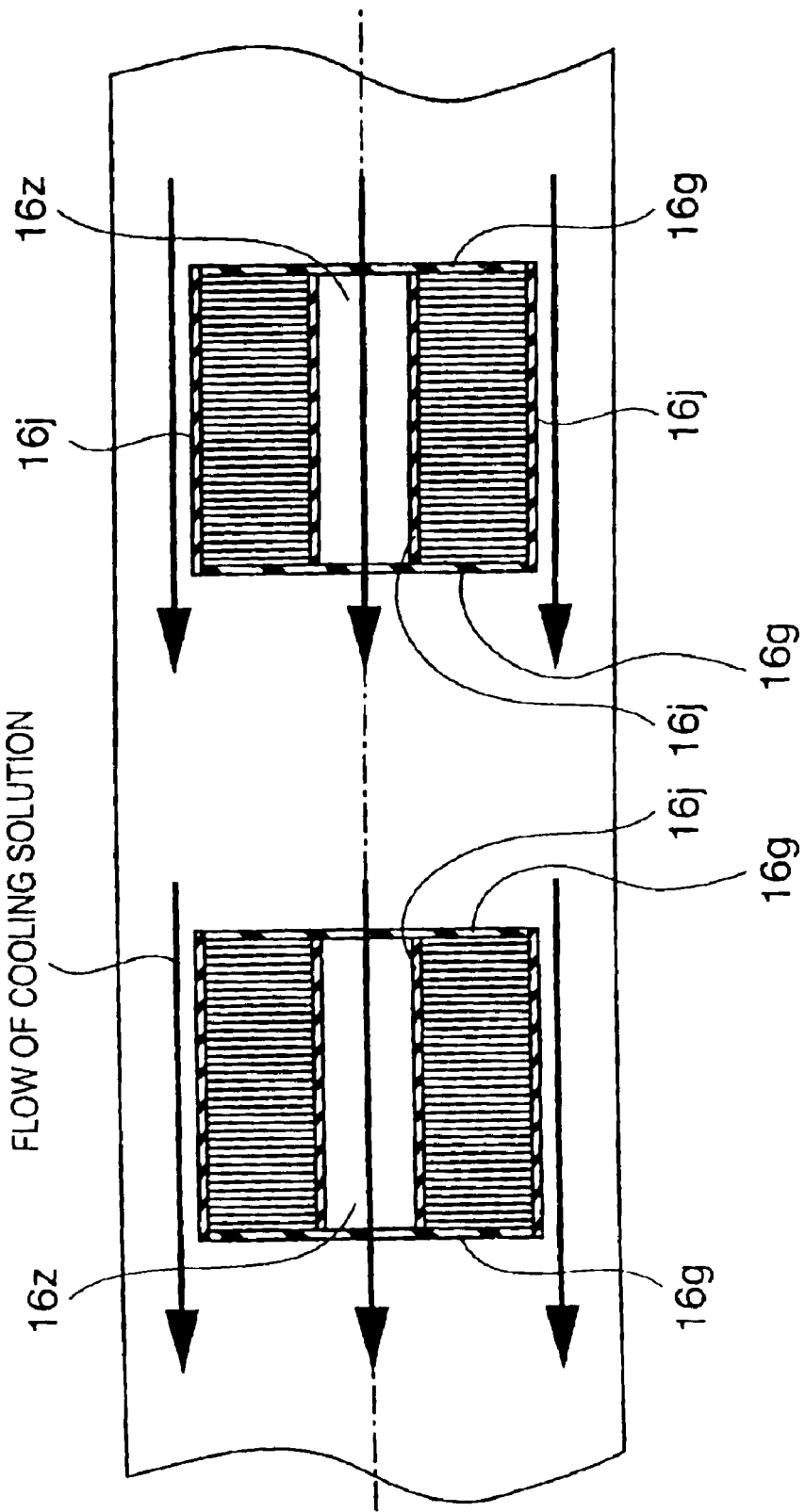
FIG. 30 is a sectional view showing the structure of a linear motor using the coil in FIGS. 29A to 29C, which is taken along the line M—M.

If cooling holes 16z are formed as through holes from the side surface of the coil 16, as shown in FIGS. 29A to 29C, a cooling solution can flow through the center of the coil 16, as shown in FIG. 30. This enables efficient cooling, which prevents a temperature rise of the coil 16. The wall surface of each cooling hole 16z is insulated by the insulating coat 16j so as to ensure insulation from the coolant and another coil, as shown in FIGS. 29B and 29C.

In the coil wound with the foil coil 16a according to the eighth embodiment, the nonconductive air gap other than the insulating base film 16c greatly decreases in comparison with a conventional coil employing the multilayered structure of a round wire. The space factor of the conductor wound in a multilayered aligned state increases to about 90% to 95%, which is about 15% to 20% higher than a space factor of about 75% for a conventional round wire.

That is, a larger number of coil turns can be obtained while the coil resistance value of a conventional round wire is maintained. The effective driving length of the coil can increase, remarkably increasing the driving current density of the coil.

Consequently, the linear motor efficiency by the stationary coil and movable magnet can be increased by about 15% to 20% for a constant volume, realizing higher speed and lower power consumption of the stage apparatus.

Embodiment of A Semiconductor Production System

A production system for producing a semiconductor device (e.g., a semiconductor chip such as an IC or LSI, a liquid crystal panel, a CCD, a thin-film magnetic head, a micromachine, or the like) will be exemplified. A trouble remedy or periodic maintenance of a manufacturing apparatus installed in a semiconductor manufacturing factory, or maintenance service such as software distribution, is performed by using a computer network outside the manufacturing factory.

Figure 31:
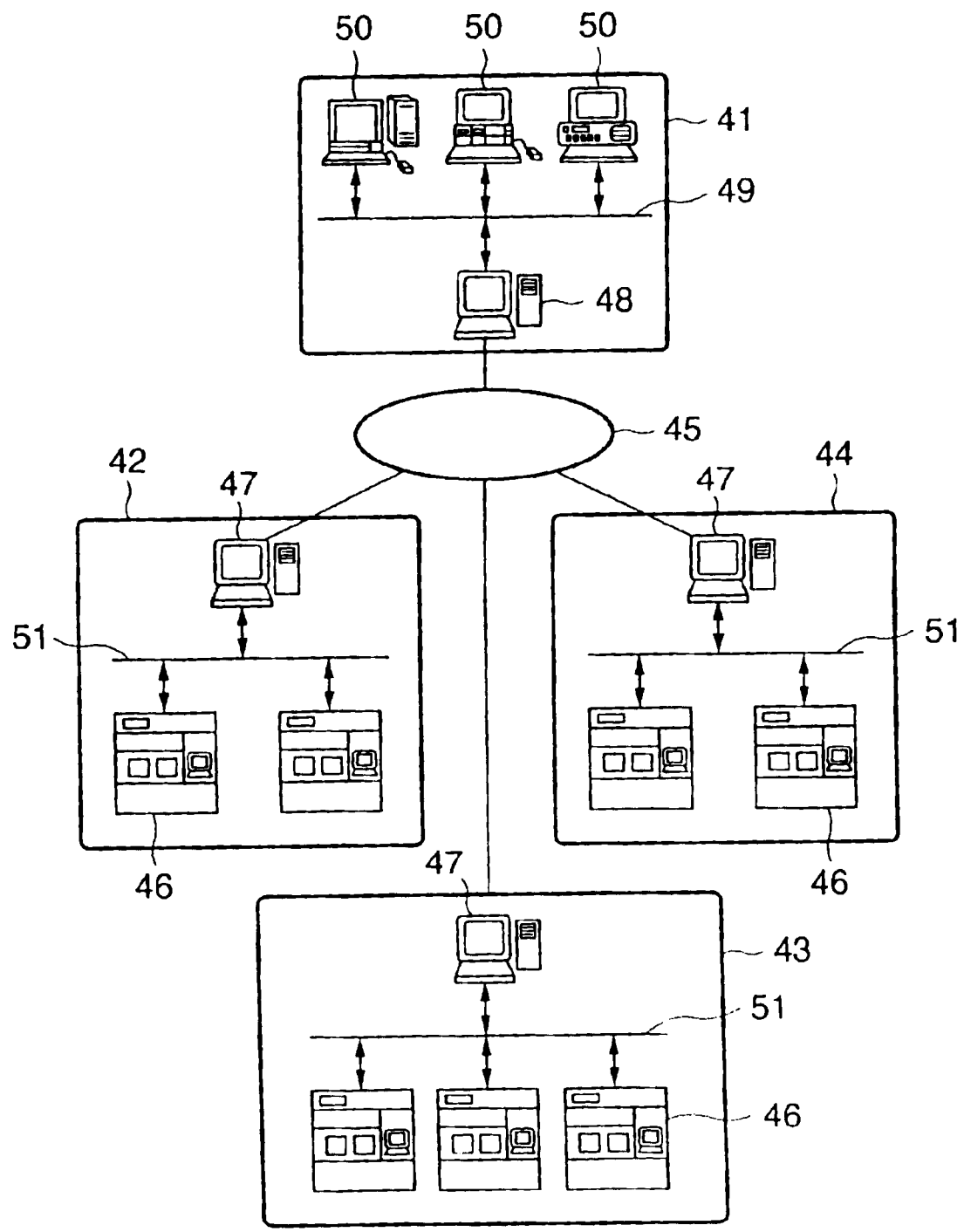
FIG. 31 is a view showing the concept of a semiconductor device production system when viewed from a given angle.

FIG. 31 shows the overall system cut out at a given angle. In FIG. 31, reference numeral 41 denotes a business office of a vendor (e.g., an apparatus supply manufacturer), which provides a semiconductor device manufacturing apparatus. Examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, inspection apparatus, and the like). The business office 41 comprises a host management system 48 for providing a maintenance database for the manufacturing apparatus, a plurality of operation terminal computers 50, and a LAN (Local Area Network) 49, which connects the host management system 48 and computers 50 to build an intranet. The host management system 48 has a gateway for connecting the LAN 49 to Internet 45 as an external network of the business office, and a security function for limiting external access.

Reference numerals 42 to 44 denote manufacturing factories of the semiconductor manufacturer or users of manufacturing apparatuses. The manufacturing factories 42 to 44 may belong to different manufacturers or the same manufacturer (e.g., a pre-process factory, a post-process factory, and the like). Each of the factories 42 to 44 is equipped with a plurality of manufacturing apparatuses 46, a LAN (Local Area Network) 51, which connects these apparatuses 46 to construct an intranet, and a host management system 47 serving as a monitoring apparatus for monitoring the operation status of each manufacturing apparatus 46. The host management system 47 in each of the factories 42 to 44 has a gateway for connecting the LAN 51 in the factory to the Internet 45 as an external network of the factory. Each factory can access the host management system 48 of the vendor 41 from the LAN 51 via the Internet 45. The security function of the host management system 48 authorizes access of only a limited user. More specifically, the factory notifies the vendor via the Internet 45 of status information (e.g., the symptom of a manufacturing apparatus in trouble) representing the operation status of each manufacturing apparatus 46, and receives response information (e.g., information designating a remedy against the trouble, or remedy software or data) corresponding to the notification, or maintenance information such as the latest software or help information. Data communication between the factories 42 to 44 and the vendor 41 and data communication via the LAN 51 in each factory adopt a communication protocol (TCP/TP) generally used in the Internet. Instead of using the Internet as an external network of the factory, a dedicated network (e.g., an ISDN) having high security, which inhibits access of a third party, can be adopted. Also, the user may construct a database in addition to the one provided by the vendor and set the database on an external network, and the host management system may authorize access to the database from a plurality of user factories.

Figure 32:
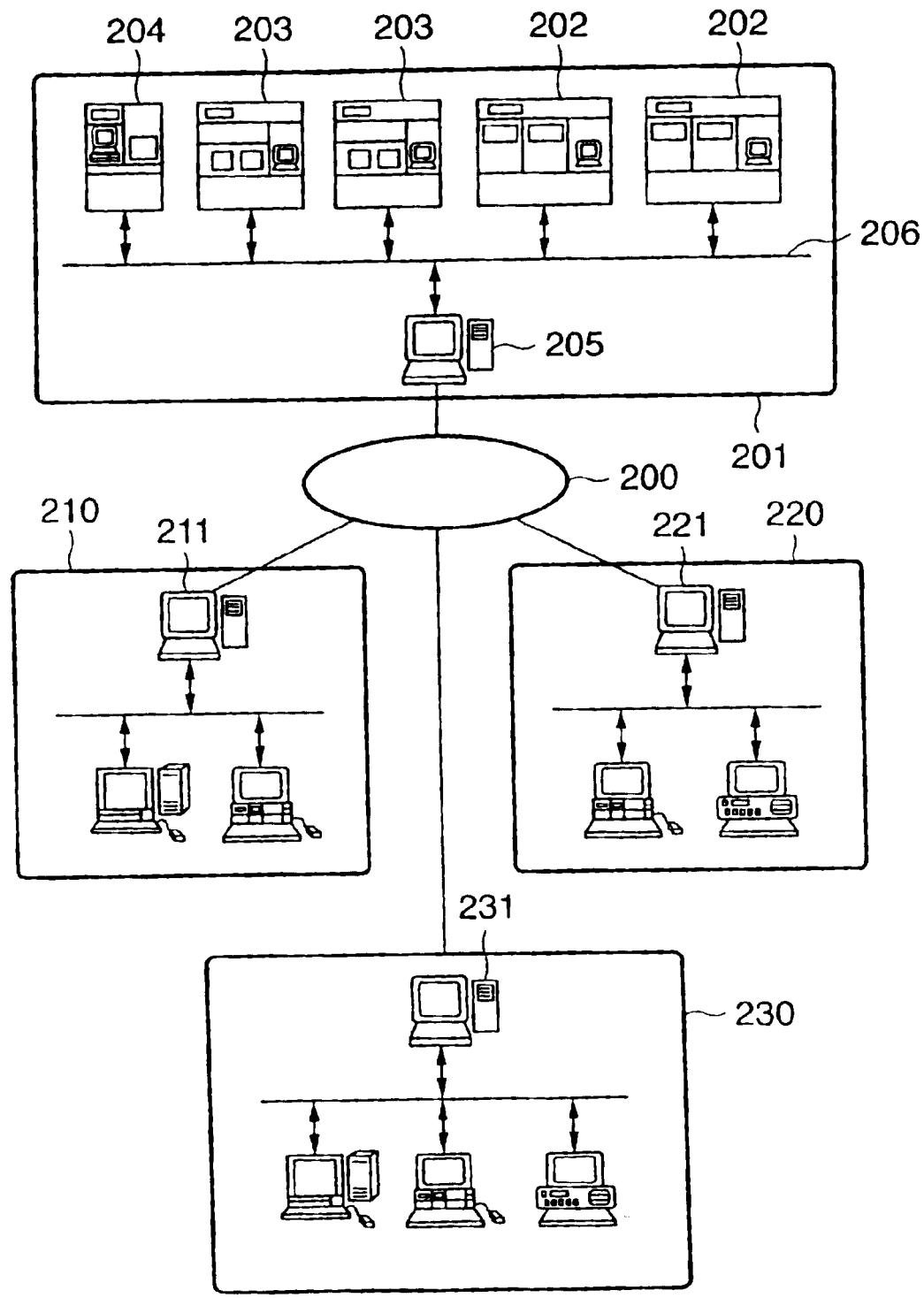
FIG. 32 is a view showing the concept of the semiconductor device production system when viewed from another angle.

FIG. 32 is a view showing the concept of the overall system of this embodiment that is cut out at a different angle from that shown in FIG. 31. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 32, a factory having manufacturing apparatuses of a plurality of vendors and the management systems of the vendors for these manufacturing apparatuses are connected via the external network of the factory, and maintenance information of each manufacturing apparatus is communicated. In FIG. 32, reference numeral 201 denotes a manufacturing factory of a manufacturing apparatus user (e.g., a semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 32 shows only one manufacturing factory 201, but a plurality of factories are networked in practice. The respective apparatuses in the factory are connected to a LAN 206 to build an intranet, and a host management system 205 manages the operation of the manufacturing line. The business offices of vendors (e.g., apparatus supply manufacturers), such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software, which are stored in a storage device. The storage device is a built-in memory, hard disk, or network file server. The network access software includes a dedicated or general-purpose web browser, and provides a user interface having a window as shown in FIG. 33 on the display. While referring to this window, the operator who manages manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 33. This allows the operator to access detailed information of each item, to receive the latest-version software to he used for a manufacturing apparatus from a software library provided by a vendor, and to receive an operation guide (help information) as a reference for the operator in the factory.

Figure 17:
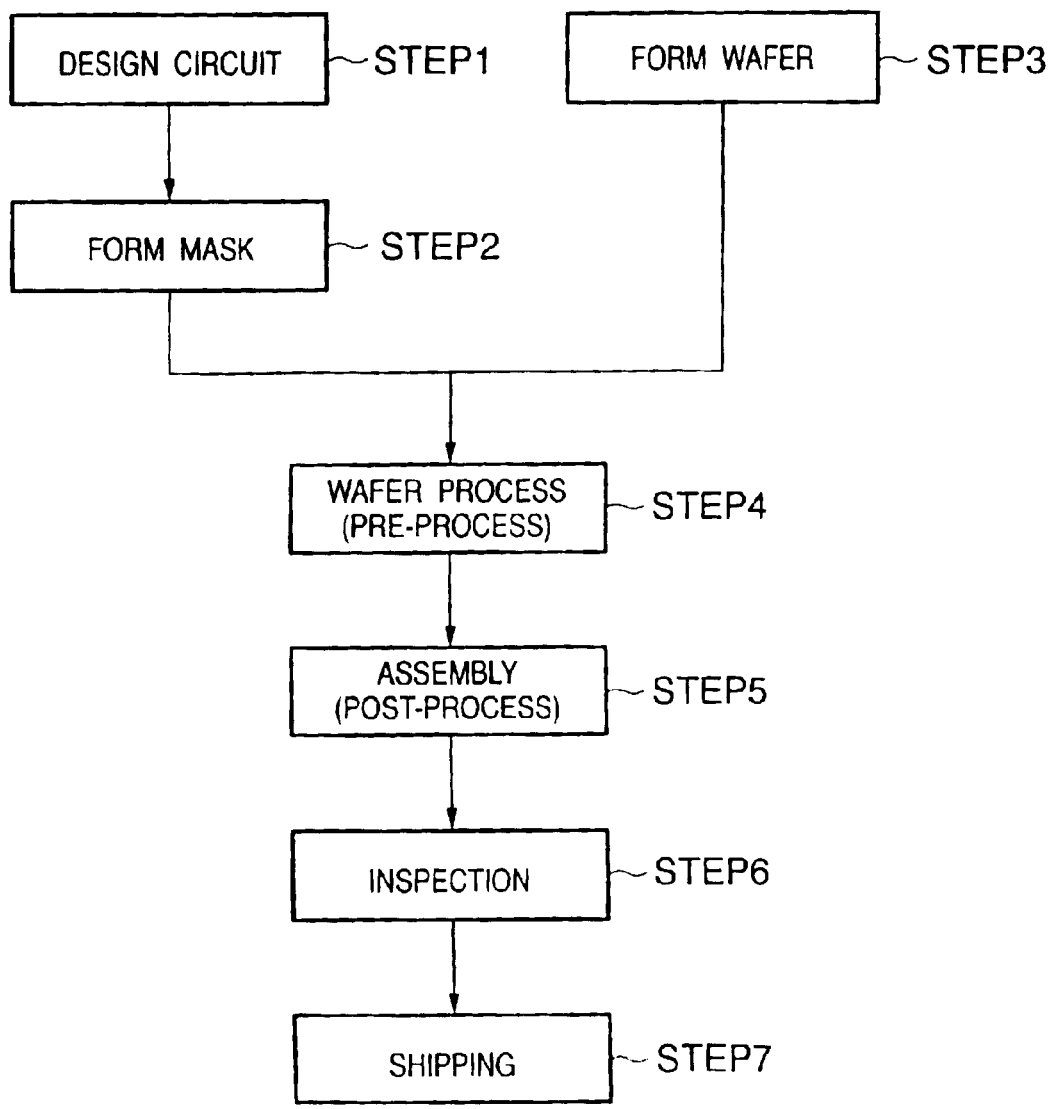
FIG. 17 is a flow chart for explaining the flow of a device manufacturing process.

A semiconductor device manufacturing process using the above-described production system will be explained. FIG. 17 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 18:
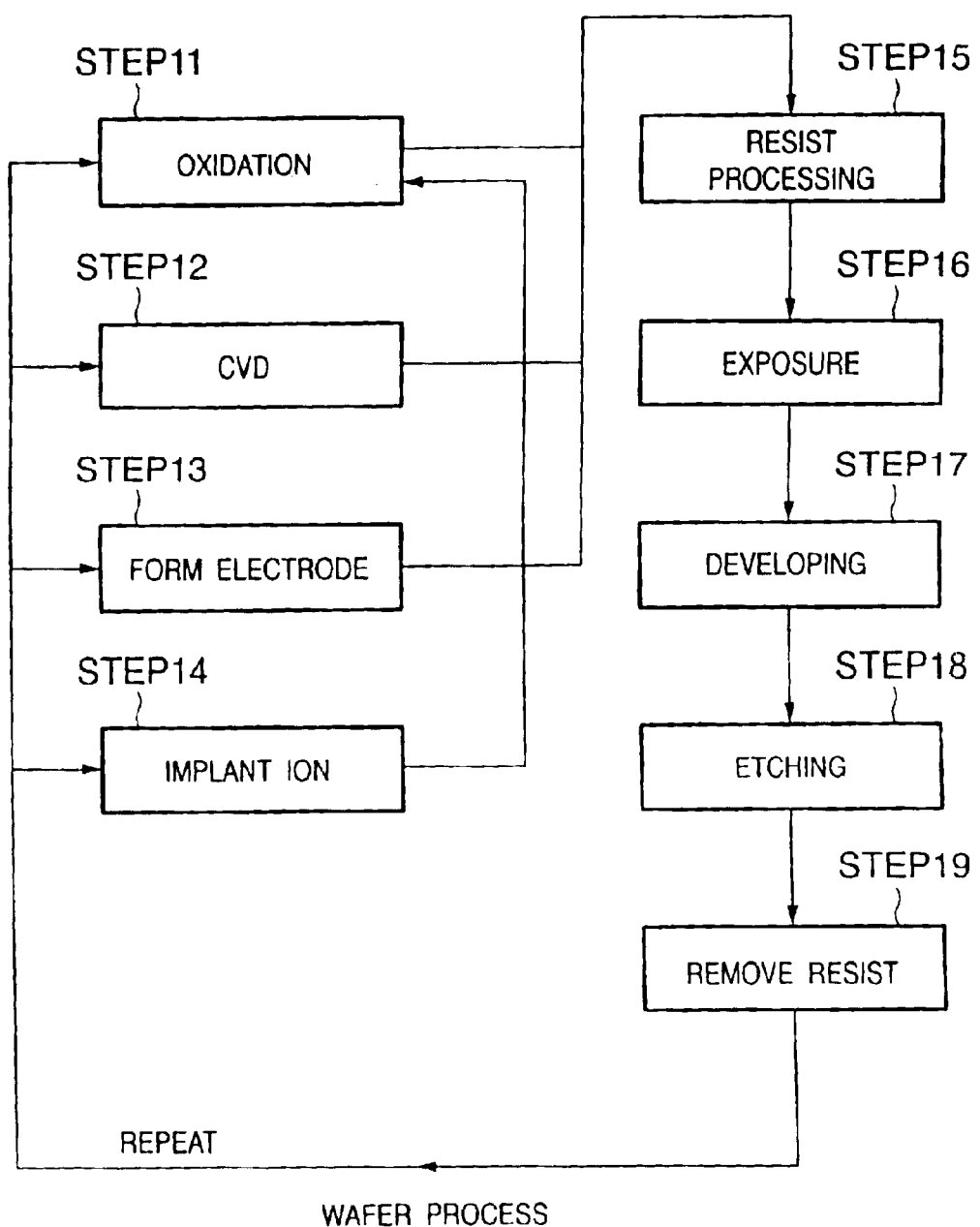
FIG. 18 is a flow chart for explaining a wafer process.

FIG. 18 shows the detailed flow of the wafer process. In step 11 (oxidation), the wafer surface is oxidized. In step 12 (CVD) an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, according to the embodiments of the present invention, a foil coil made of a foil-like conductor is wound in a multilayered structure to form a coil. The coil can remarkably decrease a nonconductive air gap and increase the space factor of the conductor with respect to the coil section. A larger number of coil turns can be obtained while the coil resistance value of a conventional round wire is maintained or reduced. The effective length of the coil for generating a driving thrust can increase, greatly increasing the driving current density of the coil.

As a result, the linear motor efficiency by the stationary coil and movable magnet can be increased for a constant volume. The use of this linear motor as a driving means for a stage apparatus can realize higher speed and lower power consumption of the stage apparatus. Further, the linear motor can increase the total throughput and exposure precision of the apparatus. The linear motor can be adopted as a linear motor for transmitting the reaction forces of reticle and wafer stages, or a damping linear motor on the mount of a main body structure which supports each stage and a projection optical system. In this case, the power consumption of the exposure apparatus can be reduced, and the exposure precision can be increased.

In winding a conductor foil having an insulating layer in a multilayered structure, the insulating layer is made slightly wider than the conductor foil. This secures insulation between conductor layers at the end of the conductor foil. A short circuit can be prevented between conductor layers to increase the reliability of the linear motor and exposure apparatus.

A through hole is formed in the coil, which allows a coolant to flow through the hole to cool the coil. As a result, the cooling efficiency of the linear motor, the thermal stability of the exposure apparatus, and the alignment precision and exposure precision increase.

The conductor foil of the coil is formed from a cladding member made of different types of conductors. In this case, weight reduction of the coil and a high-permeability material can improve the gap magnetic flux density and the frequency response characteristic of the coil. A lightweight linear motor and a high-efficiency, high-response frequency characteristic can be realized.

Forming the coil conductor foil from a high-permeability conductor material can increase the gap magnetic flux density and implement a high-efficiency linear motor.

If an insulating base film, which forms the insulating layer, uses a paraffin-based fully aromatic polyamide fiber or resin higher in rigidity than a general polyester- or polyimide-based base film, the coil rigidity after the insulating base film is wound on a coil can be increased, improving the frequency response characteristic of the linear motor.

As has been described above, according to the present invention, a linear motor for an exposure apparatus for exposing a substrate to a pattern drawn on a master surface comprises a coil wound with a foil like conductor having an insulating layer in a multilayered structure or a coil wound with a foil-like conductor via an insulating layer, and a lead line or relay substrate for connecting the inner or outer end of the coil to an external electrode. This structure can greatly decrease a nonconductive air gap and increase the space factor of the conductor with respect to the coil section. A larger number of coil turns can be obtained while the coil resistance value of a conventional round wire is maintained or reduced. The effective length of the coil for generating a driving thrust can increase, greatly increasing the driving current density of the coil. As a result, the linear motor efficiency can increase for a constant volume.

The same effects can be attained by a seamlessly continuous coil made up of a plurality of partial coils prepared by winding a foil-like conductor in a multilayered structure via an insulating layer so as to make their current rotational directions coincide with each other, or a coil obtained by winding a foil-like conductor in a multilayered structure via an insulating layer and forming a through hole. A coolant can flow to cool the coil, which increases the cooling efficiency of the linear motor and improves the thermal stability of the exposure apparatus.

If this linear motor drives a stage apparatus which supports a master or substrate, higher speed and lower power consumption of the stage apparatus can be realized, and the total throughput of the apparatus and the alignment precision and exposure precision can be increased. If the linear motor is used as a means for transmitting a reaction force from the stage apparatus, which supports a master or substrate, or a damping means for a main body structure, which supports each stage apparatus and a projection optical system, the power consumption of the exposure apparatus can be decreased, and the alignment precision and exposure precision can be increased.

As many apparently widely different embodiments of the present invention can be made without departing from the spirit and scope thereof, it is to be understood that the invention is not the specific embodiments thereof except as defined in the claims.

What is claimed is:

1. A linear motor apparatus comprising:
   a movable member having a magnet; and
   a coil wound about the magnet so as to generate a drive force for driving the movable member and having a multi-layered structure formed by winding a foil-like conductor and an insulating layer,
   wherein the foil-like conductor (i) has a plurality of partial coils having identical current application/rotation directions, and the plurality of partial coils are formed in such a way that the foil-like conductor forms a continuous, seamless strip, and (ii) is continuously wound in a multilayered, aligned state to form the coil, and adjacent layers of the foil-like conductor ate insulated by the insulating layer.

2. The linear motor apparatus of claim 1, wherein the plurality of partial coils are separated from each other in a direction of a gap in a magnetic circuit formed between the partial coils and the magnet.

3. The linear motor apparatus of claim 2, wherein the foil-like conductor is bent helically among the plurality of partial coils.

4. The linear motor apparatus of claim 2, wherein the foil-like conductor is folded at least twice among, and in a direction substantially perpendicular to, the plurality of partial coils.

5. The linear motor apparatus of claim 2, wherein the foil-like conductor is extended from the interior of the plurality of partial coils so as to connect the plurality of partial coils.

6. A linear motor apparatus comprising:
   a movable member having a magnet; and
   a coil wound about the magnet so as to generate a drive force for driving the movable member and having a multi-layered structure formed by winding a foil-like conductor and an insulating layer,
   wherein the coil has a plurality of holes through which a coolant can pass in the foil-like conductor, and the insulating layer is provided on an inner surface of each one of the holes.

7. The linear motor apparatus of claim 6, wherein the insulating layer is made of one of a polymer material and an oxide film of the foil-like conductor.

8. The linear motor apparatus of claim 6, wherein the insulating layer is an insulating film using a paraffin-based filly aromatic polyamide fiber or resin.

9. A linear motor apparatus comprising:
   a movable member having a magnet; and
   a coil wound about the magnet so as to generate a drive force for driving the movable member and having a multi-layered structure formed by winding a foil-like conductor and an insulating layer,
   wherein an edge portion of the foil-like conductor in a direction of the width of the coil is oxidized.

10. A linear motor apparatus comprising:
a movable member having a magnet; and
a coil wound about the magnet so as to generate a drive force for driving the movable member and having a multi-layered structure formed by winding a foil-like conductor and an insulating layer,
wherein the insulating layer has a width greater than a width of the foil-like conductor.

11. A linear motor apparatus comprising:
a movable member having a magnet; and
a plurality of coils wound about the magnet so as to generate a drive force for driving the movable member and having a multi-layered structure formed by winding a foil-like conductor having a plurality of coils, and an insulating layer,
wherein the plurality of coils are separated from each other in a direction of a gap in a magnetic circuit formed between the partial coils and the magnet, and
the foil-like conductor is continuously wound in a multilayered, aligned state to form the plurality of coils, and the adjacent layers of the foil-like conductor are insulated by the insulating layer.

12. An exposure apparatus for exposing a substrate to a pattern, said apparatus comprising:
a wafer stage; and
a linear motor apparatus for driving the wafer stage,
wherein the linear motor apparatus comprises:
(i) a movable member having a magnet; and
(ii) a coil wound about the magnet so as to generate a drive force for driving the movable member and having a multi-layered structure formed by winding a foil-like conductor and an insulating layer,
wherein the foil-like conductor (i) has a plurality of partial coils having identical current application/rotation directions, and the plurality of coils are formed in such a way that the foil-like conductor forms a continuous, seamless strip, and (ii) is continuously wound in a multilayered, aligned state to form the coil and adjacent layers of the foil-like conductor are insulated by the insulating layer.

13. The exposure apparatus of claim 12, wherein the plurality of partial coils are spaced or stacked in a direction of a gap in a magnetic circuit formed between the partial coils and the magnet.

14. The exposure apparatus of claim 12, further comprising a reticle stage supporting a master for exposure onto the substrate,
wherein the linear motor apparatus drives the reticle stage.

15. The exposure apparatus of claim 12, wherein the linear motor apparatus drives a stage reaction force receiver that is the movable member so as to cancel out a drive reaction torque generated by driving at least one of the wafer stage and the reticle stage.

16. The exposure apparatus of claim 12, wherein the linear motor apparatus cancels out vibration generated driving at least one of the wafer stage and the reticle stage by driving a movable damping member so as to prevent the vibration from reaching a projection optical system.

17. The exposure apparatus of claim 12, wherein the pattern is projected onto the wafer by an exposure light beam or an electron beam passing through the projection optical system.

18. The exposure apparatus of claim 17, wherein the wafer stage moves the wafer to a predetermined position so that the pattern can be projected onto the wafer.

19. A semiconductor device manufacturing method comprising the steps of:
installing a plurality of semiconductor manufacturing apparatuses, including an exposure apparatus, in a semiconductor manufacturing factory; and
manufacturing a semiconductor device by using the plurality of semiconductor manufacturing apparatuses,
wherein the exposure apparatus exposes a substrate to a pattern and comprises:
a wafer stage; and
a linear motor apparatus for driving the wafer stage,
wherein the linear motor apparatus comprises:
(i) a movable member having a magnet; and
(ii) a coil wound about the magnet so as to generate a drive force for driving the movable member and having a multi-layered structure formed by winding a foil-like conductor and an insulating layer,
wherein the foil-like conductor (i) has a plurality of partial coils having identical current application/rotation directions, and the plurality of partial coils are formed in such a way that the foil-like conductor forms a continuous, seamless strip and (ii) is continuously wound in a multilayered, aligned state to form the coil, and adjacent layers of the foil-like conductor are insulated by the insulating layer.

20. An exposure apparatus for exposing a substrate to a pattern, said apparatus comprising:
a wafer stage; and
a linear motor apparatus for driving the wafer stage,
wherein the linear motor apparatus comprises:
(i) a movable member having a magnet; and
(ii) a coil wound about the magnet so as to generate a drive force for driving the movable member and having a multi-layered structure formed by winding a foil-like conductor and an insulating layer,
wherein the coil has a plurality of holes through which a coolant can pass in the foil-like conductor, and the insulating layer is provided on an inner surface of each one of the holes.

21. The exposure apparatus of claim 20, wherein the insulating layer is made of one of a polymer material and an oxide film of the foil-like conductor.

22. The exposure apparatus of claim 20, wherein the insulating layer is an insulating film using a paraffin-based fully aromatic polyamide fiber or resin.

23. The exposure apparatus of claim 20, further comprising a reticle stage supporting a master for exposure onto the substrate,
wherein the linear motor apparatus drives the reticle stage.

24. The exposure apparatus of claim 20, wherein the linear motor apparatus drives a stage reaction force receiver that is the movable member so as to cancel out a drive reaction torque generated by driving at least one of the wafer stage and the reticle stage.

25. The exposure apparatus of claim 20, wherein the linear motor apparatus cancels out vibration generated by driving at least one of the wafer stage and the reticle stage by driving a movable damping member so as to prevent the vibration from reaching a projection optical system.

26. The exposure apparatus of claim 20, wherein the pattern is projected onto the wafer by an exposure light beam or an electron beam passing through the projection optical system.

27. The exposure apparatus of claim 20, wherein the wafer stage moves the wafer to a predetermined position so that the pattern can be projected onto the wafer.

28. A semiconductor device manufacturing method comprising the steps of:

installing a plurality of semiconductor manufacturing apparatuses, including an exposure apparatus, in a semiconductor manufacturing factory; and manufacturing a semiconductor device by using the plurality of semiconductor manufacturing apparatuses, wherein the exposure apparatus exposes a substrate to a pattern and comprises:

a wafer stage; and a linear motor apparatus for driving the wafer stage, wherein the linear motor apparatus comprises:

(i) a movable member having a magnet; and (ii) a coil wound about the magnet so as to generate a drive force driving the movable member and having a multi-layered structure formed by winding a foil-like conductor and an insulating layer, wherein the coil has a plurality of holes through which a coolant can pass in the foil-like conductor, and the insulating layer is provided on an inner surface of each one of the holes.

29. An exposure apparatus for exposing a pattern onto a substrate, said apparatus comprising:

a wafer stage; and a linear motor apparatus for driving the wafer stage, wherein the linear motor apparatus comprises:

(i) a movable member having a magnet; and (ii) a coil wound about the magnet so as to generate a drive force for driving the movable member and having a multi-layered structure formed by winding a foil-like conductor and an insulating layer, wherein an edge portion of the foil-like conductor in the direction of the width of the coil is oxidized.

30. The exposure apparatus of claim 29, further comprising a reticle stage supporting a master for exposure onto the substrate, wherein the linear motor apparatus drives the reticle stage.

31. The exposure apparatus of claim 29, wherein the linear motor apparatus drives a stage reaction force receiver that is the movable member so as to cancel out a drive reaction torque generated by driving at least one of the wafer stage and the reticle stage.

32. The exposure apparatus of claim 29, wherein the linear motor apparatus cancels out vibration generated when driving at least one of the wafer stage and the reticle stage by driving a movable damping member so as to prevent the vibration from reaching a projection optical system.

33. The exposure apparatus of claim 29, wherein the pattern is projected onto the wafer by an exposure light beam or an electron beam passing through the projection optical system.

34. The exposure apparatus of claim 29, wherein the wafer stage moves the wafer to a predetermined position so that the pattern can be projected onto the wafer.

35. A semiconductor device manufacturing method comprising the steps of:

installing a plurality of semiconductor manufacturing apparatuses, including an exposure apparatus, in a semiconductor manufacturing factory; and manufacturing a semiconductor device by using the plurality of semiconductor manufacturing apparatuses, wherein the exposure apparatus exposes a substrate to a pattern and comprises:

a wafer stage; and a linear motor apparatus for driving the wafer stage, wherein the linear motor apparatus comprises:

(i) a movable member having a magnet; and (ii) a coil wound about the magnet so as to generate a drive force for driving the movable member and having a multi-layered structure formed by winding a foil-like conductor and an insulating layer, wherein an edge portion of the foil-like conductor in the direction of the width of the coil is oxidized.

36. An exposure apparatus for exposing a substrate to a pattern, said apparatus comprising:

a wafer stage; and a linear motor apparatus for driving the wafer stage, wherein the linear motor apparatus comprises:

(i) a movable member having a magnet; and (ii) a coil wound about the magnet so as to generate a drive force for driving the movable member and having a multi-layered structure formed by winding a foil-like conductor and an insulating layer, wherein the insulating layer has a width greater than a width of the foil-like conductor.

37. The exposure apparatus of claim 36, further comprising a reticle stage supporting a master for exposure onto the substrate, wherein the linear motor apparatus drives the reticle stage.

38. The exposure apparatus of claim 36, wherein the linear motor apparatus drives a stage reaction force receiver that is the movable member so as to cancel out a drive reaction torque generated by driving at least one of the wafer stage and the reticle stage.

39. The exposure apparatus of claim 36, wherein the linear motor apparatus cancels out vibration generated by driving at least one of the wafer stage and the reticle stage by driving a movable damping member so as to prevent the vibration from reaching a projection optical system.

40. The exposure apparatus of claim 36, wherein the pattern is projected onto the wafer by an exposure light beam or an electron beam passing through the projection optical system.

41. The exposure apparatus of claim 36, wherein the wafer stage moves the wafer to a predetermined position so that the pattern can be projected onto the wafer.

42. A semiconductor device manufacturing method comprising the steps of:

installing a plurality of semiconductor manufacturing apparatuses, including an exposure apparatus, in a semiconductor manufacturing factory; and manufacturing a semiconductor device by using the plurality of semiconductor manufacturing apparatuses, wherein the exposure apparatus exposes a substrate to a pattern and comprises:

a wafer stage; and a linear motor apparatus for driving the wafer stage, wherein the linear motor apparatus comprises:

(i) a movable member having a magnet; and (ii) a coil wound about the magnet so as to generate a drive force for driving the movable member and having a multi-layered structure formed by winding a foil-like conductor and an insulating layer, wherein the insulating layer has a width greater than a width of the foil-like conductor.

43. A linear motor comprising:

a movable member having a magnet; and a coil wound about the magnet so as to generate a drive force for driving the movable member and having a multilayered structure formed by winding a foil-like conductor and an insulating layer, wherein the foil-like conductor is a cladding member with a multilayered structure made up of conductors of different materials.

44. The linear motor apparatus of claim 43, wherein the conductors of different materials include a copper foil and an aluminum foil.

45. The linear motor apparatus of claim 43, wherein the conductors of different materials include a conductive material and a high-permeability material.

46. An exposure apparatus for exposing a substrate to a pattern, said apparatus comprising:

a wafer stage; and a linear motor apparatus for driving the wafer stage, wherein the linear motor apparatus comprises:

(i) a movable member having a magnet; and (ii) a coil wound about the magnet so as to generate a drive force for driving the movable member and having a multilayered structure formed by winding a foil-like conductor and an insulating layer, wherein the foil-like conductor is a cladding member with a multilayered structure made up of conductors of different materials.

47. A semiconductor device manufacturing method comprising the steps of:

installing a plurality of semiconductor manufacturing apparatuses, including an exposure apparatus, in a semiconductor manufacturing factory; and manufacturing a semiconductor device by using the plurality of semiconductor manufacturing apparatuses, wherein the apparatus exposes a substrate to a pattern and comprises:

a wafer stage; and a linear motor apparatus for driving the wafer stage, wherein the linear motor apparatus comprises:

(i) a movable member having a magnet; and (ii) a coil wound about the magnet so as to generate a drive force for driving the movable member and having a multilayered structure formed by winding a foil-like conductor and an insulating layer;

wherein the foil-like conductor is a cladding member with a multilayered structure made up of conductors of different materials.

* * * * *

UNITED STATES PATENT AND TRADEMARK OFFICE
CERTIFICATE OF CORRECTION

PATENT NO.    : 6,791,670 B2
DATED         : September 14, 2004
INVENTOR(S)   : Yoshikazu Miyajima et al.

It is certified that error appears in the above-identified patent and that said Letters Patent is hereby corrected as shown below:

Title page,
Item [56], References Cited, FOREIGN PATENT DOCUMENTS,
"JP     10-309071     11/1988" should read -- JP     10-309071     11/1998 --.
"JP     2000209838 A  * 7/2000" should read -- JP     2000-209838 A * 7/2000 --.
Item [57], ABSTRACT,
Line 4, "multi-layer" should read -- multi-layered --.

Column 1,
Line 53, "portion 1," should read -- portion I, --.

Column 6,
Line 13, "FIG. 29A," should read -- FIG. 29A; --.

Column 7,
Lines 39 and 40, "comer" should read -- corner --.

Column 8,
Line 8, "Fine" should read -- fine --.

Column 11,
Line 34, "allow" should read -- alloy --.
Line 47, "a" should read -- $\alpha$ --.

Column 12,
Line 2, "acopper-" should read -- a copper- --.
Line 3, "allow" should read -- alloy --.
Line 34, "cooper" should read -- copper --.

Column 14,
Line 3, "A" should read -- a --.
Line 65, "(TCP/TP)" should read -- (TCP/IP) --.

Column 16,
Line 4, "he" should read -- be --.

UNITED STATES PATENT AND TRADEMARK OFFICE
CERTIFICATE OF CORRECTION

PATENT NO.    : 6,791,670 B2
DATED         : September 14, 2004
INVENTOR(S)   : Yoshikazu Miyajima et al.

It is certified that error appears in the above-identified patent and that said Letters Patent is hereby corrected as shown below:

<u>Column 18,</u>
Line 11, "not" should read -- not limited to --.
Line 26, "ate" should read -- are --.
Line 58, "filly" should read -- fully --.

Signed and Sealed this

Eleventh Day of January, 2005

JON W. DUDAS
*Director of the United States Patent and Trademark Office*